United States Patent
Lim et al.

(10) Patent No.: US 10,050,518 B2
(45) Date of Patent: Aug. 14, 2018

(54) POWER SUPPLY CIRCUITS WITH VARIABLE NUMBER OF POWER INPUTS AND CROSS-COUPLED DIODES AND STORAGE DEVICES HAVING THE SAME

(71) Applicant: Samsung Electronics Co., Ltd., Suwon-si, Gyeonggi-do (KR)

(72) Inventors: Hyoung-Taek Lim, Seoul (KR); Chung-Hyun Ryu, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/196,473

(22) Filed: Jun. 29, 2016

(65) Prior Publication Data
US 2017/0084332 A1 Mar. 23, 2017

(30) Foreign Application Priority Data
Sep. 23, 2015 (KR) .................. 10-2015-0134507

(51) Int. Cl.
G11C 14/00 (2006.01)
G11C 16/30 (2006.01)
H02M 3/04 (2006.01)

(52) U.S. Cl.
CPC .............. *H02M 3/04* (2013.01); *G11C 16/30* (2013.01)

(58) Field of Classification Search
CPC ............................ G11C 14/0018; H02M 3/04
See application file for complete search history.

(56) References Cited

U.S. PATENT DOCUMENTS

| | | | | |
|---|---|---|---|---|
| 5,426,391 A | * | 6/1995 | Tedrow | G11C 5/143 327/530 |
| 5,444,664 A | * | 8/1995 | Kuroda | G06F 9/24 365/185.29 |
| 5,483,486 A | * | 1/1996 | Javanifard | G11C 5/143 327/536 |
| 5,598,041 A | * | 1/1997 | Willis | H02J 1/108 307/43 |

(Continued)

FOREIGN PATENT DOCUMENTS

| JP | 2013-074638 | 4/2013 |
|---|---|---|
| JP | 2015-023766 | 2/2015 |

OTHER PUBLICATIONS

Texas Instruments Application Report ("Load Switches: What Are They, Why Do You Need Them and How Do You Choose the Right One?", Apr. 2014).*

*Primary Examiner* — Anthan Tran
*Assistant Examiner* — Mushfique Siddique
(74) *Attorney, Agent, or Firm* — Myers Bigel, P.A.

(57) ABSTRACT

A power supply circuit may include a first power converter that may be configured to generate a first inner supply voltage having a first voltage level based on a first external supply voltage and to output the first inner supply voltage to a first node that is coupled to the first node, a second power converter that may be configured to generate a second inner supply voltage having the first voltage level based on a second external supply voltage and to output the second inner supply voltage to a second node that is coupled to the second node, a first diode that may include an anode coupled to the first node and a cathode coupled to the second node, and a second diode that may include an anode coupled to the second node and a cathode coupled to the first node.

20 Claims, 10 Drawing Sheets

(56) References Cited

U.S. PATENT DOCUMENTS

| | | | | |
|---|---|---|---|---|
| 5,663,918 A * | 9/1997 | Javanifard | ............ | G11C 5/143 365/185.33 |
| 5,671,179 A * | 9/1997 | Javanifard | ............ | G11C 5/143 365/185.33 |
| 5,715,153 A * | 2/1998 | Lu | ............ | H02M 3/33561 363/146 |
| 5,864,221 A * | 1/1999 | Downs | ............ | H02J 1/108 320/134 |
| 5,929,539 A * | 7/1999 | Kozaru | ............ | G05F 1/465 307/130 |
| 6,411,068 B1 * | 6/2002 | Willis | ............ | H02M 3/1563 323/282 |
| 6,954,103 B2 * | 10/2005 | Yamauchi | ............ | G11C 5/14 327/540 |
| 7,274,113 B2 * | 9/2007 | Ebata | ............ | G06F 1/30 307/64 |
| 7,495,989 B2 * | 2/2009 | Choi | ............ | G11C 5/145 365/149 |
| 7,518,939 B2 * | 4/2009 | Choi | ............ | G11C 5/145 365/149 |
| 7,675,267 B2 * | 3/2010 | Ozawa | ............ | H02J 7/0031 307/66 |
| 7,683,584 B2 * | 3/2010 | Choi | ............ | H02J 7/0068 307/46 |
| 7,709,976 B2 * | 5/2010 | Bazinet | ............ | H02M 1/10 307/80 |
| 7,800,249 B1 * | 9/2010 | Ko | ............ | H02J 7/0034 307/66 |
| 7,936,156 B2 * | 5/2011 | Hasegawa | ............ | H02M 3/1588 323/282 |
| 7,944,190 B2 * | 5/2011 | Ozawa | ............ | H02J 7/0065 323/229 |
| 7,996,726 B2 * | 8/2011 | Ito | ............ | G01R 31/31724 714/42 |
| 8,151,036 B2 * | 4/2012 | Yasufuku | ............ | G06F 12/0246 711/103 |
| 8,310,094 B2 * | 11/2012 | Yamada | ............ | H02J 7/35 307/46 |
| 8,400,026 B2 * | 3/2013 | Park | ............ | H02J 7/345 307/109 |
| 8,479,032 B2 * | 7/2013 | Trantham | ............ | G06F 1/30 711/100 |
| 8,504,860 B2 * | 8/2013 | Trantham | ............ | G06F 1/263 713/300 |
| 8,598,734 B2 * | 12/2013 | Kusumi | ............ | B60L 11/123 307/10.1 |
| 8,634,218 B2 * | 1/2014 | Kung | ............ | H02M 7/219 363/127 |
| 8,659,945 B2 * | 2/2014 | Kim | ............ | G11C 16/0483 365/185.02 |
| 8,853,888 B2 | 10/2014 | Khaligh | | |
| 8,867,278 B2 * | 10/2014 | Kang | ............ | G11C 11/5628 365/185.2 |
| 8,904,095 B2 * | 12/2014 | Kim | ............ | G06F 3/0613 711/100 |
| 8,984,375 B2 * | 3/2015 | Hashimoto | ............ | G06F 11/004 714/47.2 |
| 8,996,964 B2 * | 3/2015 | Choi | ............ | H03M 13/3784 714/780 |
| 9,048,513 B2 * | 6/2015 | Butzmann | ............ | H01M 10/425 |
| 9,070,443 B2 * | 6/2015 | Park | ............ | G11C 16/04 |
| 9,189,397 B2 * | 11/2015 | Jung | ............ | G06F 12/0802 |
| 9,190,120 B2 * | 11/2015 | Shim | ............ | G11C 5/147 |
| 9,208,894 B2 * | 12/2015 | Lee | ............ | G06F 1/26 |
| 9,236,866 B2 * | 1/2016 | Youn | ............ | H03K 19/017509 |
| 9,245,541 B1 * | 1/2016 | Trantham | ............ | G11B 5/09 |
| 9,245,640 B2 * | 1/2016 | Kim | ............ | G11C 5/14 |
| 9,252,603 B2 * | 2/2016 | Shim | ............ | H02J 7/0016 |
| 9,274,886 B2 * | 3/2016 | Chae | ............ | G06F 11/1048 |
| 9,304,855 B2 * | 4/2016 | Kang | ............ | G06F 11/1048 |
| 9,324,444 B2 * | 4/2016 | Park | ............ | G11C 16/30 |
| 9,335,955 B2 * | 5/2016 | Kim | ............ | G06F 3/0689 |
| 9,392,653 B2 * | 7/2016 | Lee | ............ | H05B 33/0815 |
| 9,395,779 B2 * | 7/2016 | Choi | ............ | G06F 1/26 |
| 9,405,671 B2 * | 8/2016 | Tanaka | ............ | G11C 16/06 |
| 9,424,922 B2 * | 8/2016 | Um | ............ | G11C 15/04 |
| 9,432,018 B2 * | 8/2016 | Park | ............ | H03K 19/0013 |
| 9,436,267 B2 * | 9/2016 | Shin | ............ | G06F 1/3275 |
| 9,472,300 B2 * | 10/2016 | Park | ............ | G11C 16/3445 |
| 9,484,069 B2 * | 11/2016 | Shim | ............ | G11C 5/141 |
| 9,489,037 B2 * | 11/2016 | Heo | ............ | G06F 1/3296 |
| 9,531,249 B2 * | 12/2016 | Yoon | ............ | H02M 3/1588 |
| 2002/0114184 A1 * | 8/2002 | Gongwer | ............ | G11C 5/14 365/185.11 |
| 2004/0145931 A1 * | 7/2004 | Lin | ............ | G11C 16/30 363/147 |
| 2006/0139819 A1 * | 6/2006 | May | ............ | H02J 1/102 361/18 |
| 2006/0152085 A1 * | 7/2006 | Flett | ............ | B60L 9/30 307/75 |
| 2006/0261779 A1 * | 11/2006 | Maleus | ............ | H02J 7/0018 320/128 |
| 2007/0047365 A1 * | 3/2007 | Yoshinaga | ............ | G11C 5/147 365/226 |
| 2007/0216379 A1 * | 9/2007 | Kitagawa | ............ | H02M 3/07 323/265 |
| 2007/0260918 A1 * | 11/2007 | Okada | ............ | G06F 1/30 714/14 |
| 2008/0111526 A1 * | 5/2008 | Shuey | ............ | H02M 3/156 323/274 |
| 2008/0205134 A1 * | 8/2008 | Kato | ............ | G11C 16/30 365/185.2 |
| 2010/0146333 A1 * | 6/2010 | Yong | ............ | G06F 1/305 714/14 |
| 2010/0220039 A1 * | 9/2010 | Park | ............ | H02M 3/1588 345/76 |
| 2010/0332858 A1 * | 12/2010 | Trantham | ............ | G06F 1/263 713/300 |
| 2010/0332859 A1 * | 12/2010 | Trantham | ............ | G06F 1/26 713/300 |
| 2010/0332860 A1 * | 12/2010 | Trantham | ............ | G06F 1/263 713/300 |
| 2011/0080761 A1 * | 4/2011 | Kung | ............ | H02M 7/219 363/127 |
| 2011/0089993 A1 * | 4/2011 | Shumkov | ............ | H02M 1/08 327/427 |
| 2011/0148325 A1 * | 6/2011 | Trovo' | ............ | H02M 1/14 315/307 |
| 2011/0221413 A1 * | 9/2011 | Pigott | ............ | H02M 3/1588 323/283 |
| 2011/0273024 A1 * | 11/2011 | Butzmann | ............ | H02J 7/0013 307/82 |
| 2012/0025606 A1 * | 2/2012 | Zheng | ............ | H02M 3/285 307/11 |
| 2012/0117409 A1 * | 5/2012 | Lee | ............ | G06F 1/26 713/340 |
| 2012/0218817 A1 * | 8/2012 | Kang | ............ | G11C 11/5628 365/185.2 |
| 2013/0003462 A1 * | 1/2013 | Castagna | ............ | G11C 5/14 365/185.23 |
| 2013/0043732 A1 * | 2/2013 | Li | ............ | H03F 1/0227 307/82 |
| 2013/0088289 A1 * | 4/2013 | Kang | ............ | H01L 23/642 327/564 |
| 2013/0201768 A1 * | 8/2013 | Kang | ............ | G11C 5/147 365/189.09 |
| 2013/0254464 A1 * | 9/2013 | Kimura | ............ | G06F 12/0246 711/103 |
| 2013/0301372 A1 * | 11/2013 | Park | ............ | G11C 5/14 365/227 |
| 2014/0047246 A1 * | 2/2014 | Seol | ............ | G06F 21/79 713/193 |
| 2014/0063875 A1 * | 3/2014 | Al-Shyoukh | ............ | H02M 1/36 363/49 |
| 2014/0112082 A1 * | 4/2014 | Lee | ............ | G11C 7/20 365/189.011 |
| 2014/0152109 A1 * | 6/2014 | Kanakasabai | ............ | H02J 9/062 307/66 |

(56) References Cited

U.S. PATENT DOCUMENTS

| | | | |
|---|---|---|---|
| 2014/0159506 A1 | 6/2014 | Kim et al. | |
| 2014/0204680 A1* | 7/2014 | Kim | G11C 16/0483 |
| | | | 365/185.21 |
| 2014/0246906 A1* | 9/2014 | Wang | H02J 9/061 |
| | | | 307/23 |
| 2014/0246908 A1 | 9/2014 | Chew et al. | |
| 2015/0023072 A1* | 1/2015 | Al-Shyoukh | H02M 1/36 |
| | | | 363/49 |
| 2015/0061540 A1* | 3/2015 | Park | H05B 33/0896 |
| | | | 315/294 |
| 2015/0153794 A1* | 6/2015 | Choi | G06F 1/26 |
| | | | 713/300 |
| 2015/0205338 A1* | 7/2015 | Cho | G06F 1/30 |
| | | | 713/300 |
| 2015/0340099 A1* | 11/2015 | Kwak | G11C 16/34 |
| | | | 711/103 |
| 2015/0340949 A1* | 11/2015 | Holmberg | H02M 3/157 |
| | | | 323/271 |
| 2015/0357005 A1* | 12/2015 | Shim | G11C 5/141 |
| | | | 365/228 |
| 2016/0336856 A1* | 11/2016 | Jin | H02M 3/158 |
| 2016/0380443 A1* | 12/2016 | Jeon | H02J 7/0014 |
| | | | 320/112 |
| 2017/0063082 A1* | 3/2017 | Lee | G05F 1/10 |
| 2017/0201092 A1* | 7/2017 | Minato | H02J 1/00 |
| 2017/0201122 A1* | 7/2017 | Arduini | H02J 9/061 |
| 2017/0214252 A1* | 7/2017 | Preindl | H02J 7/0014 |

\* cited by examiner

US 10,050,518 B2

POWER SUPPLY CIRCUITS WITH VARIABLE NUMBER OF POWER INPUTS AND CROSS-COUPLED DIODES AND STORAGE DEVICES HAVING THE SAME

CROSS-REFERENCE TO RELATED APPLICATION(S)

The present application claims priority under 35 USC § 119 to Korean Patent Application No. 10-2015-0134507, filed on Sep. 23, 2015 in the Korean Intellectual Property Office (KIPO), the disclosure of which is hereby incorporated herein by reference in its entirety.

FIELD

Example embodiments relate to power supplies for semiconductor devices, and more particularly to power supply circuits and a storage devices including the power supply circuits.

BACKGROUND

Generally, electronic devices may convert an external supply voltage to an operation voltage having a voltage level appropriate for an operation of internal elements of an electrical device. In addition, electronic devices may be divided into single power input electronic devices, which operate using one external supply voltage, and multiple power input electronic devices, which operate using multiple external supply voltages. Generally, a power supply circuit included in a single power input electronic device may have a different hardware structure from a power supply circuit included in a multiple power input electronic device. Therefore, the power supply circuit for the single power input electronic device and the power supply circuit for the multiple power input electronic device may be designed separately. In addition, a power supply circuit included in a multiple power input electronic device may have more power loss in the process of generating operation voltages based on the multiple external supply voltages than a power supply circuit included in a single power input electronic device.

SUMMARY

Some embodiments of the inventive concepts are directed to power supply circuits that may be configured to operate regardless of a number of external supply voltages and decreases a power loss. Some example embodiments are directed to storage devices including a power supply circuit that may be configured to operate regardless of a number of external supply voltages and decreases a power loss.

According to some embodiments of the inventive concepts, power supply circuits may be provided. A power supply circuit may include a first power converter, a second power converter, a first diode, a second diode, a first load, and a second load. The first power converter may be configured to receive a first external supply voltage, to generate a first inner supply voltage having a first voltage level based on the first external supply voltage, and to output the first inner supply voltage to a first node. The second power converter may be configured to receive a second external supply voltage, to generate a second inner supply voltage having the same first voltage level as the first inner supply voltage based on the second external supply voltage, and to output the second inner supply voltage to a second node. The first diode may include an anode that is coupled to the first node and a cathode that is coupled to the second node. The second diode may include an anode that is coupled to the second node and a cathode that is coupled to the first node. The first load may be coupled to the first node. The second load may be coupled to the second node.

In some embodiments, the first power converter may be configured to receive a voltage level of the first external supply voltage that is different from a voltage level of the second external supply voltage that the second power converter is configured to receive.

In some embodiments, the first power converter may include a DC (direct current)/DC converter, the first inner supply voltage may include a DC voltage, and the first external supply voltage may include a DC voltage. The second power converter may include a DC/DC converter, the second inner supply voltage may include a DC voltage, and the second external supply voltage may include a DC voltage.

In some embodiments, a forward voltage drop of the first diode may be substantially the same as a forward voltage drop of the second diode.

In some embodiments, the first load may include a DC/DC converter that is configured to generate a first DC operation voltage by converting a magnitude of a DC voltage at the first node, and the second load may include a DC/DC converter that is configured to generate a second DC operation voltage by converting a magnitude of a DC voltage at the second node.

In some embodiments, when the first external supply voltage is provided to the first power converter and the second external supply voltage is provided to the second power converter, the first diode and the second diode may be configured to be turned off, the first load may be configured to operate based on the first inner supply voltage, and the second load may be configured to operate based on the second inner supply voltage.

In some embodiments, when the first external supply voltage is provided to the first power converter and the second external supply voltage to the second power converter is interrupted, the first diode may be configured to be turned on, the second diode may be configured to be turned off, and the first load and the second load may be configured to operate based on the first inner supply voltage.

In some embodiments, when the first external supply voltage to the first power converter is interrupted and the second external supply voltage is provided to the second power converter, the first diode may be configured to be turned off, the second diode may be configured to be turned on, and the first load and the second load may be configured to operate based on the second inner supply voltage.

According to some embodiments of the inventive concepts, storage devices are provided. A storage device may include a plurality of nonvolatile memory devices, a controller, a volatile memory device, and a power supply circuit. The controller may be configured to control operations of the plurality of nonvolatile memory devices. The volatile memory device be configured to operate as an input/output buffer of the controller. The power supply circuit may be configured to receive a first external supply voltage and a second external supply voltage through a first power line and a second power line, respectively, and to provide a plurality of operation voltages to the plurality of nonvolatile memory devices, the controller, and the volatile memory device based on the first external supply voltage and the second external supply voltage. The power supply circuit may be further configured to generate the plurality of operation voltages using both of the first external supply voltage and the second external supply voltage when the power supply circuit receives both of the first external supply voltage and the second external supply voltage. The power supply circuit may be further configured to generate the plurality of operation voltages using only one of the first external supply voltage or the second external supply voltage when the power supply circuit receives only the one of the first external supply voltage and the second external supply voltage.

In some embodiments, the power supply circuit may include a first power converter, a second power converter, a first diode, a second diode, a third power converter, and a fourth power converter. The first power converter may be configured to receive the first external supply voltage, to generate a first inner supply voltage having a first voltage level based on the first external supply voltage, and output the first inner supply voltage to a first node. The second power converter may be configured to receive the second external supply voltage, to generate a second inner supply voltage having the same first voltage level as the first inner supply voltage based on the second external supply voltage, and output the second inner supply voltage to a second node. The first diode may include an anode that is coupled to the first node and a cathode that is coupled to the second node. The second diode may include an anode that is coupled to the second node and a cathode that is coupled to the first node. The third power converter may be configured to generate at least a first one of the plurality of operation voltages based on a voltage that is received through the first node. The fourth power converter may be configured to generate a second one of the plurality of operation voltages based on a voltage that is received through the second node.

In some embodiments, the first power converter may be configured to receive a voltage level of the first external supply voltage that is different from a voltage level of the second external supply voltage that the second power converter is configured to receive.

In some embodiments, the first power converter may be configured to receive the first external supply voltage that may have a voltage level of about 12V, the second power converter may be configured to receive the second external supply voltage that may have a voltage level of about 5V, and the first voltage level of the first and second inner supply voltages may be about 5V.

In some embodiments, each of the first through fourth power converters may include a DC/DC converter that is configured to generate a DC voltage based on a received DC voltage.

In some embodiments, the controller may be configured to receive a command signal, an address signal, and data from a host through a signal connector, and the power supply circuit may be configured to receive the first external supply voltage and/or the second external supply voltage from the host through a power connector.

In some embodiments, the storage device may include a solid state drive (SSD) device.

According to some embodiments of the inventive concepts, devices are provided. A device may include a first power converter that may be configured to receive a first external supply voltage and to generate a first inner supply voltage having a first voltage level based on the first external supply voltage. The device may include a second power converter that may be configured to receive a second external supply voltage and to generate a second inner supply voltage having the same first voltage level as the first inner supply voltage based on the second external supply voltage. The device may include a third power converter that may be configured to receive the first inner supply voltage from the first power converter at the first voltage level when the first power converter receives the first external supply voltage, to receive a first auxiliary voltage that is based on the second inner supply voltage from the second power converter at a second voltage level that is less than the first voltage level when the first power converter does not receive the first external supply voltage and the second power converter does receive the second external supply voltage, and to generate a first operational voltage based on a received one of the first inner supply voltage or the first auxiliary voltage. The device may include a fourth power converter that may be configured to receive the second inner supply voltage from the second power converter at the first voltage level when the second power converter receives the second external supply voltage, to receive a second auxiliary voltage that is based on the first inner supply voltage from the first power converter at the second voltage level when the second power converter does not receive the second external supply voltage and the first power converter does receive the first external supply voltage, and to generate a second operational voltage based on a received one of the second inner supply voltage or the second auxiliary voltage.

In some embodiments, the device may further include a first diode that may be configured to provide the first auxiliary voltage to the third power converter when the first power converter does not receive the first external supply voltage and the second power converter does receive the second external supply voltage. The device may further include a second diode that may be configured to provide the second auxiliary voltage to the fourth power converter when the second power converter does not receive the second external supply voltage and the first power converter does receive the first external supply voltage. A difference in voltage level between the second inner supply voltage and the first auxiliary voltage may be equal to a forward voltage drop of the first diode. A difference in voltage level between the first inner supply voltage and the second auxiliary voltage may be equal to a forward voltage drop of the second diode.

In some embodiments, the device may further include a power management integrated circuit that includes the first power converter and the second power converter.

In some embodiments, the device may further include a fifth a power converter that may be configured to receive a third external supply voltage and to generate a third inner supply voltage having the same first voltage level as the first inner supply voltage based on the third external supply voltage. The device may further include a sixth power converter that may be configured to receive the third inner supply voltage from the fifth power converter at the first voltage level when the fifth power converter receives the third external supply voltage, to receive a third auxiliary voltage that is based on at least one of the first and/or second inner supply voltages from the respective at least one of the first and/or second power converters at the second voltage level when the fifth power converter does not receive the third external supply voltage and the at least one of the first and/or second power converters does receive the respective one of the first and second external supply voltages, and to generate a third operational voltage based on a received one of the third inner supply voltage or the third auxiliary voltage.

In some embodiments, the device may further include a third diode that may be configured to provide the first auxiliary voltage to the third power converter when the first power converter does not receive the first external supply voltage and the fifth power converter does receive the third external supply voltage. The device may further include a fourth diode that may be configured to provide the second auxiliary voltage to the fourth power converter when the second power converter does not receive the second external supply voltage and the fifth power converter does receive the third external supply voltage. The device may further include a fifth diode that may be configured to provide the third auxiliary voltage to the sixth power converter when the fifth power converter does not receive the third external supply voltage and the first power converter does receive the first external supply voltage. The device may further include a sixth diode that may be configured to provide the third auxiliary voltage to the sixth power converter when the fifth power converter does not receive the third external supply voltage and the second power converter does receive the second external supply voltage.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The above and other objects, features, and advantages of the present disclosure will become more apparent to those of ordinary skill in the art by describing in detail embodiments of the inventive concepts thereof with reference to the accompanying drawings, in which.

DETAILED DESCRIPTION OF THE EMBODIMENTS

Figure 1:
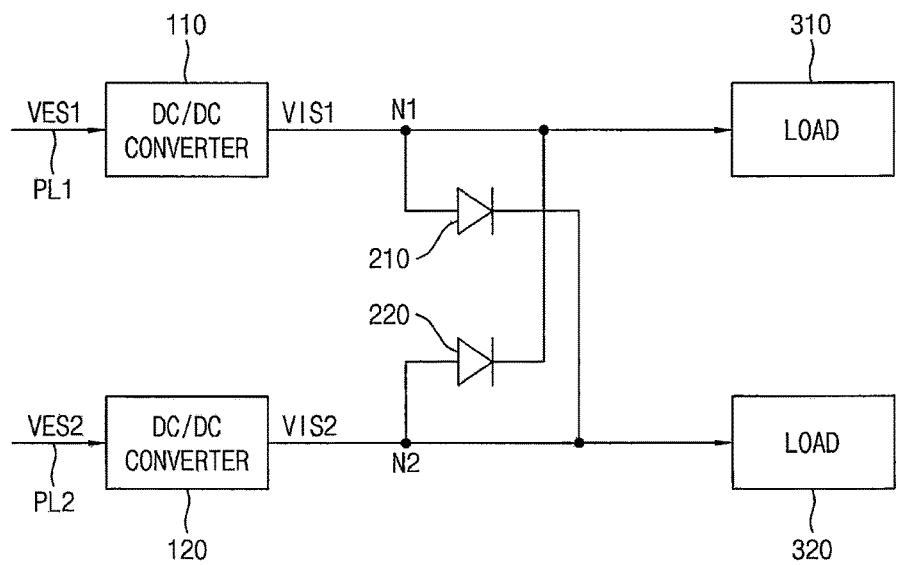
FIG. 1 is a block diagram schematically illustrating a power supply circuit according to some embodiments of the inventive concepts.

Various example embodiments will be described more fully with reference to the accompanying drawings, in which some example embodiments are shown. The present inventive concepts may, however, be embodied in many different forms and should not be construed as limited to the embodiments set forth herein. Like reference numerals refer to like elements throughout this application.

It will be understood that, although the terms first, second, etc. may be used herein to describe various elements, these elements should not be limited by these terms. These terms may be used to distinguish one element from another. For example, a first element could be termed a second element, and, similarly, a second element could be termed a first element, without departing from the scope of the present inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein to describe particular embodiments of the inventive concepts is not intended to limit the scope of the inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the present inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating a power supply circuit according to some embodiments of the inventive concepts. Referring to FIG. 1, a power supply circuit 10 may include a first power converter 110, a second power converter 120, a first diode 210, a second diode 220, a first load 310, and a second load 320.

The first power converter 110 may be configured to receive a first external supply voltage VES1 through a first power line PL1. When a first external power source is coupled to the first power line PL1 and the first external power source provides the first external supply voltage VES1 to the first power converter 110 through the first power line PL1, the first power converter 110 may generate a first inner supply voltage VIS1 having a first voltage level based on the first external supply voltage VES1, and output the first inner supply voltage VIS1 to a first node N1. In some embodiments of the inventive concepts, the first power converter 110 may generate the first inner supply voltage VIS1 by converting a voltage level of the first external supply voltage VES1. In some embodiments of the inventive concepts, the first power converter 110 may generate the first inner supply voltage VIS1 having the same voltage level as the voltage level of the first external supply voltage VES1.

When the first external power source is detached from the first power line PL1 or the first external power source stops providing the first external supply voltage VES1 to the first power converter 110 through the first power line PL1, the first power converter 110 may be turned off without generating the first inner supply voltage VIS1.

The second power converter 120 may be configured to receive a second external supply voltage VES2 through a second power line PL2. When a second external power source is coupled to the second power line PL2 and the second external power source provides the second external supply voltage VES2 to the second power converter 120 through the second power line PL2, the second power converter 120 may generate a second inner supply voltage VIS2 having the same first voltage level as the first inner supply voltage VIS1 based on the second external supply voltage VES2, and output the second inner supply voltage VIS2 to a second node N2. In some embodiments of the inventive concepts, the second power converter 120 may generate the second inner supply voltage VIS2 by converting a voltage level of the second external supply voltage VES2. In some embodiments of the inventive concepts, the second power converter 120 may generate the second inner supply voltage VIS2 having the same voltage level as the voltage level of the second external supply voltage VES2.

When the second external power source is detached from the second power line PL2 or the second external power source stops providing the second external supply voltage VES2 to the second power converter 120 through the second power line PL2, the second power converter 120 may be turned off without generating the second inner supply voltage VIS2.

In some embodiments of the inventive concepts, a voltage level of the first external supply voltage VES1 may be different from a voltage level of the second external supply voltage VES2. For example, the voltage level of the first external supply voltage VES1 may correspond to one of 12V, 5V, and 3.3V which may be generally used as supply voltages of electronic devices, and the voltage level of the second external supply voltage VES2 may correspond to another of 12V, 5V, and 3.3V. However, embodiments of the inventive concepts are not limited thereto. According to some embodiments of the inventive concepts, the first external supply voltage VES1 and the second external supply voltage VES2 may have various voltage levels.

Therefore, the first power converter 110 and the second power converter 120 may generate the first inner supply voltage VIS1 and the second inner supply voltage VIS2 that have the same voltage level as each other when the first external supply voltage VES1 and the second external supply voltage VES2 have different voltage levels from each other, respectively.

In some embodiments of the inventive concepts, each of the first external supply voltage VES1, the second external supply voltage VES2, the first inner supply voltage VIS1, and the second inner supply voltage VIS2 may be a direct current (DC) voltage. In such embodiments, the first power converter 110 may correspond to a DC/DC converter, which may generate the first inner supply voltage VIS1 of a DC voltage based on the first external supply voltage VES1 of a DC voltage, and the second power converter 120 may correspond to a DC/DC converter, which may generate the second inner supply voltage VIS2 of a DC voltage based on the second external supply voltage VES2 of a DC voltage.

The first diode 210 may include an anode coupled to the first node N1 and a cathode coupled to the second node N2. Therefore, the first diode 210 may be turned on when a voltage at the first node N1 is higher than a voltage at the second node N2 by a threshold voltage of the first diode 210 or more.

As used herein, a diode may be referred to as "turned on" when a positive voltage level between the anode and the cathode of the diode is equal to or greater than a threshold voltage of the diode. The threshold voltage of a diode may also be referred to as the forward voltage, the cut-in voltage, or the on-voltage. As used herein, a diode may be referred to as being "turned off" when a voltage level between the anode and the cathode of the diode is less than the threshold voltage of the diode, no voltage level is present between the anode and the cathode of the diode, or a negative voltage level exists.

The second diode 220 may include an anode coupled to the second node N2 and a cathode coupled to the first node N1. Therefore, the second diode 220 may be turned on when a voltage at the second node N2 is higher than a voltage at the first node N1 by a threshold voltage of the second diode 220 or more.

In some embodiments of the inventive concepts, a forward voltage drop of the first diode 210 may be substantially the same as a forward voltage drop of the second diode 220.

The first load 310 may be coupled to the first node N1 and operate using a voltage that is received through the first node N1.

The second load 320 may be coupled to the second node N2 and operate using a voltage that is received through the second node N2.

The first load 310 and the second load 320 may correspond to any semiconductor devices.

For example, the first load 310 may correspond to a DC/DC converter which may generate an operation voltage of a DC voltage based on a DC voltage at the first node N1, and the second load 320 may correspond to a DC/DC converter which may generate an operation voltage of a DC voltage based on a DC voltage at the second node N2.

Figure 2:
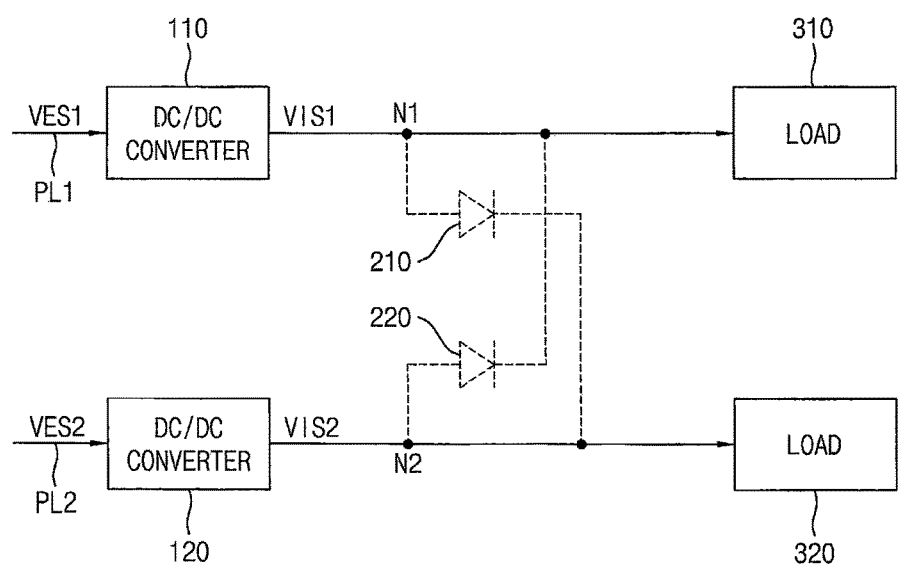
FIGS. 2 to 4 are block diagrams schematically illustrating operations of the power supply circuit of FIG. 1 according to some embodiments of the inventive concepts.
Figure 3:
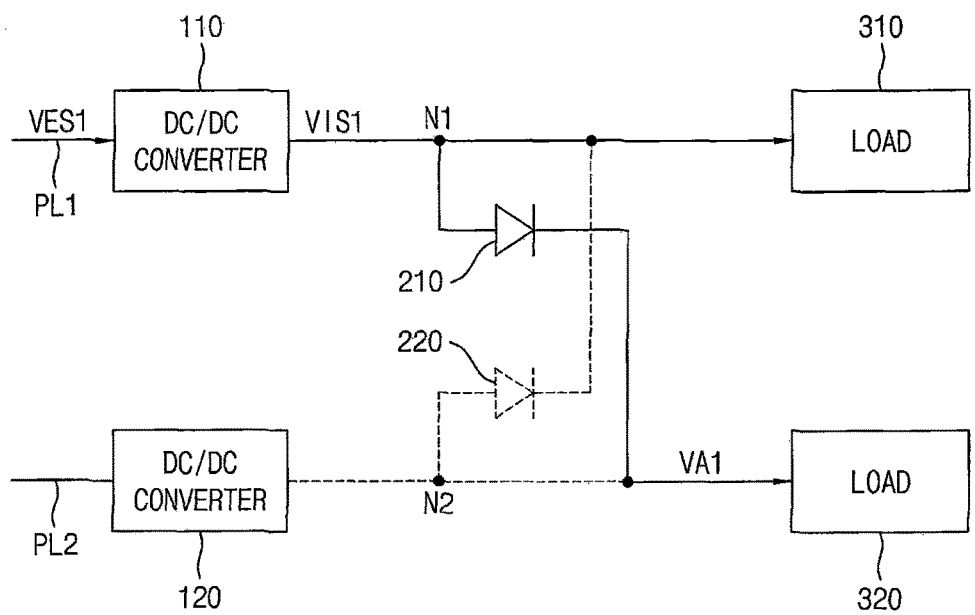
Figure 4:
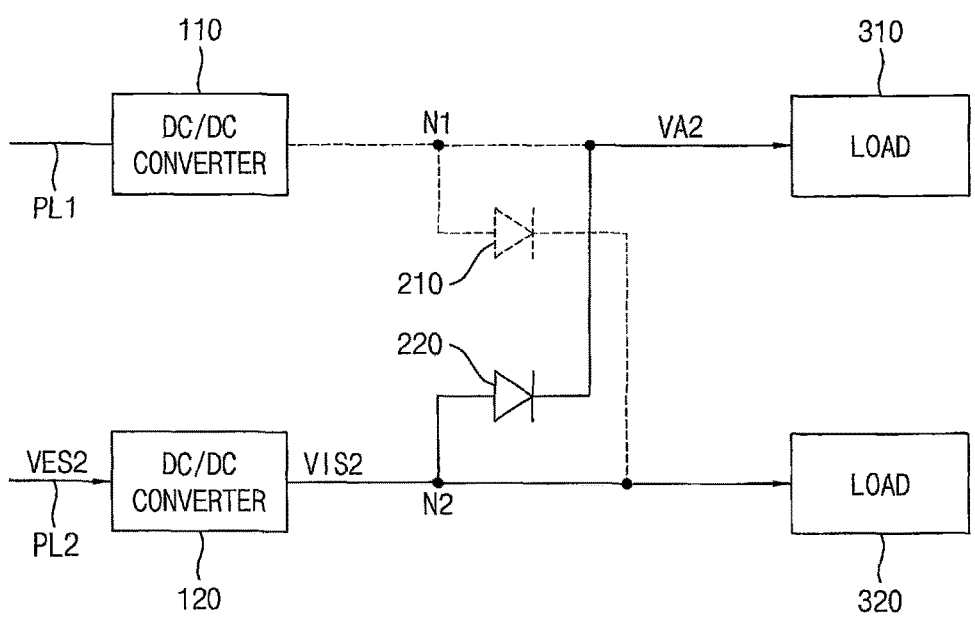

FIGS. 2 to 4 are block diagrams schematically illustrating operations of the power supply circuit of FIG. 1 according to some embodiments of the inventive concepts. Hereinafter, an operation of the power supply circuit 10 of FIG. 1 will be described with reference to FIGS. 1 to 4.

FIG. 2 illustrates an operation of the power supply circuit 10 when both the first external supply voltage VES1 and the second external supply voltage VES2 are provided to the power supply circuit 10. Referring to FIG. 2, when the first external supply voltage VES1 is provided to the first power converter 110 through the first power line PL1 and the second external supply voltage VES2 is provided to the second power converter 120 through the second power line PL2, the first power converter 110 may be turned on to output the first inner supply voltage VIS1 to the first node N1, and the second power converter 120 may be turned on to output the second inner supply voltage VIS2 to the second node N2.

As described above with reference to FIG. 1, since the voltage level of the first inner supply voltage VIS1 may be the same as the voltage level of the second inner supply voltage VIS2, the voltage at the first node N1 may be the same as the voltage at the second node N2. Therefore, as illustrated in FIG. 2, both of the first diode 210 and the second diode 220 may be turned off.

Therefore, the first load 310 may operate using the first inner supply voltage VIS1 that is generated by the first power converter 110, and the second load 320 may operate using the second inner supply voltage VIS2 that is generated by the second power converter 120.

FIG. 3 illustrates an operation of the power supply circuit 10 when the first external supply voltage VES1 is provided to the power supply circuit 10 and the second external supply voltage VES2 is not provided to the power supply circuit 10. Referring to FIG. 3, since the first external supply voltage VES1 may be provided to the first power converter 110 through the first power line PL1, the first power converter 110 may be turned on to output the first inner supply voltage VIS1 to the first node N1.

On the other hand, since the second external supply voltage VES2 to the second power converter 120 may be interrupted, the second power converter 120 may be turned off without outputting the second inner supply voltage VIS2 to the second node N2.

Since the voltage at the first node N1 may be higher than the voltage at the second node N2, as illustrated in FIG. 3, the first diode 210 may be turned on and the second diode 220 may be turned off. Therefore, both of the first load 310 and the second load 320 may operate based on the first inner supply voltage VIS1 that is generated by the first power converter 110.

For example, the first diode 210 may provide a first auxiliary voltage VA1, which may be lower than the first inner supply voltage VIS1 by the forward voltage drop of the first diode 210, to the second node N2. Therefore, the first load 310 may operate using the first inner supply voltage VIS1 that is received through the first node N1, and the second load 320 may operate using the first auxiliary voltage VA1 that is received through the second node N2.

FIG. 4 illustrates an operation of the power supply circuit 10 when the first external supply voltage VES1 is not provided to the power supply circuit 10 and the second external supply voltage VES2 is provided to the power supply circuit 10. Referring to FIG. 4, since the first external supply voltage VES1 to the first power converter 110 may be interrupted, the first power converter 110 may be turned off without outputting the first inner supply voltage VIS1 to the first node N1. On the other hand, since the second external supply voltage VES2 may be provided to the second power converter 120 through the second power line PL2, the second power converter 120 may be turned on to output the second inner supply voltage VIS2 to the second node N2. Since the voltage at the second node N2 may be higher than the voltage at the first node N1, as illustrated in FIG. 4, the second diode 220 may be turned on and the first diode 210 may be turned off. Therefore, both of the first load 310 and the second load 320 may operate based on the second inner supply voltage VIS2 that is generated by the second power converter 120.

For example, the second diode 220 may provide a second auxiliary voltage VA2, which may be lower than the second inner supply voltage VIS2 by the forward voltage drop of the second diode 220, to the first node N1. Therefore, the second load 320 may operate using the second inner supply voltage VIS2 that is received through the second node N2, and the first load 310 may operate using the second auxiliary voltage VA2 that is received through the first node N1.

As described above with reference to FIG. 1, the forward voltage drop of the first diode 210 may be substantially the same as the forward voltage drop of the second diode 220. Therefore, levels of voltages provided to the first load 310 and the second load 320, respectively, when the first external supply voltage VES1 is provided to the power supply circuit 10 and the second external supply voltage VES2 is not provided to the power supply circuit 10 may be the same as levels of voltages provided to the second load 320 and the first load 310, respectively, when the first external supply voltage VES1 is not provided to the power supply circuit 10 and the second external supply voltage VES2 is provided to the power supply circuit 10.

As described above with reference to FIG. 2, when both the first external supply voltage VES1 and the second external supply voltage VES2 are provided to the power supply circuit 10, both of the first diode 210 and the second diode 220 may be turned off, such that power loss caused by a voltage drop at the first diode 210 and the second diode 220 may not occur. In addition, since the first load 310 may operate using power that is provided through the first power line PL1, and the second load 320 may operate using power that is provided through the second power line PL2, the total power consumed by the first load 310 and the second load 320 may be dispersed between the first power line PL1 and the second power line PL2. Therefore, loads of the first power line PL1 and the second power line PL2 may be balanced.

On the other hand, as described above with reference to FIGS. 3 and 4, although only one of the first external supply voltage VES1 and the second external supply voltage VES2 may be provided to the power supply circuit 10, the first load 310 and the second load 320 may operate stably based on the one of the first external supply voltage VES1 and the second external supply voltage VES2 that is provided to the power supply circuit 10.

Therefore, the power supply circuit 10 according to some embodiments of the inventive concepts may operate regardless of the number of external supply voltages provided to the power supply circuit 10 as long as at least one of the external supply voltages are provided to the power supply circuit 10. As such, the power supply circuit 10 may be commonly used in semiconductor devices which operate using various number of external supply voltages.

Figure 5:
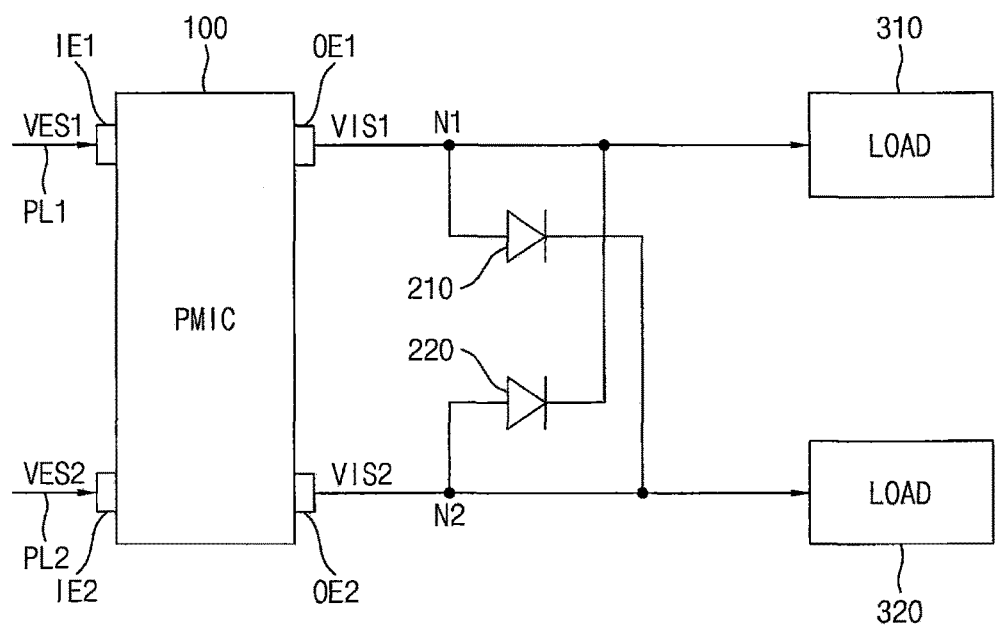
FIG. 5 is a block diagram schematically illustrating a power supply circuit according to some embodiments of the inventive concepts.

FIG. 5 is a block diagram schematically illustrating a power supply circuit according to some embodiments of the inventive concepts. Referring to FIG. 5, a power supply circuit 20 may include a power management integrated circuit PMIC 100, a first diode 210, a second diode 220, a first load 310, and a second load 320.

Elements of the power supply circuit 20 of FIG. 5 may be the same as elements of the power supply circuit 10 of FIG. 1 except as described herein. For example, the power supply circuit 20 may include the power management integrated circuit 100 instead of the first power converter 110 and the second power converter 120.

The power management integrated circuit 100 may include a first input electrode IE1 coupled to a first power line PL1, a second input electrode IE2 coupled to a second power line PL2, a first output electrode OE1 coupled to a first node N1, and a second output electrode OE2 coupled to a second node N2.

The power management integrated circuit 100 may be configured to receive a first external supply voltage VES1 through the first power line PL1 and receive a second external supply voltage VES2 through the second power line PL2.

When a first external power source is coupled to the first power line PL1 and the first external power source provides the first external supply voltage VES1 to the power management integrated circuit 100 through the first power line PL1, the power management integrated circuit 100 may generate a first inner supply voltage VIS1 having a first voltage level based on the first external supply voltage VES1, and output the first inner supply voltage VIS1 through the first output electrode OE1. In some embodiments of the inventive concepts, the power management integrated circuit 100 may generate the first inner supply voltage VIS1 by converting a voltage level of the first external supply voltage VES1. In some embodiments of the inventive concepts, the power management integrated circuit 100 may generate the first inner supply voltage VIS1 having the same voltage level as the voltage level of the first external supply voltage VES1.

When the first external power source is detached from the first power line PL1 or the first external power source stops providing the first external supply voltage VES1 to the power management integrated circuit 100 through the first power line PL1, the power management integrated circuit 100 may not generate the first inner supply voltage VIS1.

When a second external power source is coupled to the second power line PL2 and the second external power source provides the second external supply voltage VES2 to the power management integrated circuit 100 through the second power line PL2, the power management integrated circuit 100 may generate a second inner supply voltage VIS2 having the same first voltage level as the first inner supply voltage VIS1 based on the second external supply voltage VES2, and output the second inner supply voltage VIS2 through the second output electrode OE2. In some embodiments of the inventive concepts, the power management integrated circuit 100 may generate the second inner supply voltage VIS2 by converting a voltage level of the second external supply voltage VES2. In some embodiments of the inventive concepts, the power management integrated circuit 100 may generate the second inner supply voltage VIS2 having the same voltage level as the voltage level of the second external supply voltage VES2.

When the second external power source is detached from the second power line PL2 or the second external power source stops providing the second external supply voltage VES2 to the power management integrated circuit 100 through the second power line PL2, the power management integrated circuit 100 may not generate the second inner supply voltage VIS2.

The first diode 210, the second diode 220, the first load 310, and the second load 320 included in the power supply circuit 20 of FIG. 5 may be the same as the first diode 210, the second diode 220, the first load 310, and the second load 320 included in the power supply circuit 10 of FIG. 1, respectively. Therefore, duplicated description may be omitted herein for brevity.

As described above with reference to FIG. 5, since the power supply circuit 20 of FIG. 5 may include the power management integrated circuit 100 performing both an operation of the first power converter 110 and an operation of the second power converter 120 included in the power supply circuit 10 of FIG. 1, the power supply circuit 20 may be implemented more easily.

Figure 6:
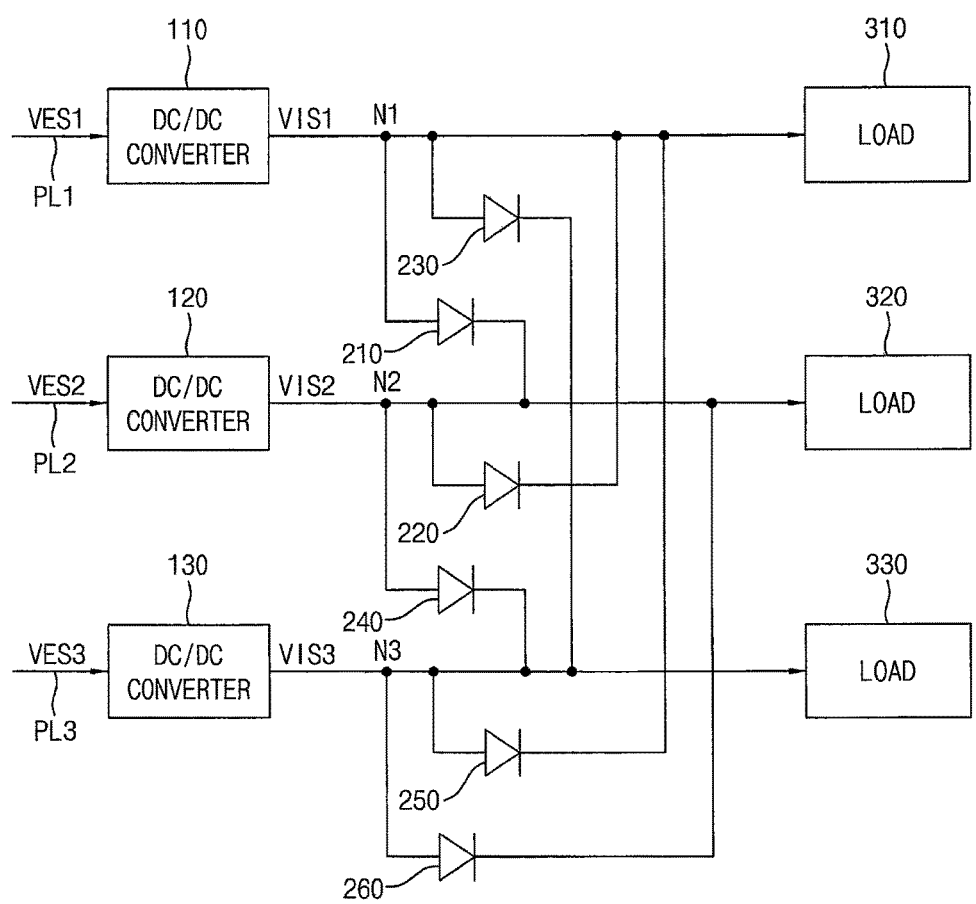
FIG. 6 is a block diagram schematically illustrating a power supply circuit according to some embodiments of the inventive concepts.

FIG. 6 is a block diagram schematically illustrating a power supply circuit according to some embodiments of the inventive concepts. Referring to FIG. 6, a power supply circuit 30 may include a first power converter 110, a second power converter 120, a third power converter 130, a first diode 210, a second diode 220, a third diode 230, a fourth diode 240, a fifth diode 250, a sixth diode 260, a first load 310, a second load 320, and a third load 330.

The first power converter 110 and the second power converter 120 included in the power supply circuit 30 of FIG. 6 may be the same as the first power converter 110 and the second power converter 120 included in the power supply circuit 10 of FIG. 1, respectively. Therefore, duplicated description may be omitted herein for brevity.

The third power converter 130 may be configured to receive a third external supply voltage VES3 through a third power line PL3. When a third external power source is coupled to the third power line PL3 and the third external power source provides the third external supply voltage VES3 to the third power converter 130 through the third power line PL3, the third power converter 130 may generate a third inner supply voltage VIS3 having the same first voltage level as the first inner supply voltage VIS1 based on the third external supply voltage VES3, and output the third inner supply voltage VIS3 to a third node N3. In some embodiments of the inventive concepts, the third power converter 130 may generate the third inner supply voltage VIS3 by converting a voltage level of the third external supply voltage VES3. In some embodiments of the inventive concepts, the third power converter 130 may generate the third inner supply voltage VIS3 having the same voltage level as the voltage level of the third external supply voltage VES3.

When the third external power source is detached from the third power line PL3 or the third external power source stops providing the third external supply voltage VES3 to the third power converter 130 through the third power line PL3, the third power converter 130 may be turned off without generating the third inner supply voltage VIS3.

In some embodiments of the inventive concepts, one or more of a voltage level of the first external supply voltage VES1, a voltage level of the second external supply voltage VES2, and a voltage level of the third external supply voltage VES3 may be different from each other. For example, the voltage level of the first external supply voltage VES1, the voltage level of the second external supply voltage VES2, and the voltage level of the third external supply voltage VES3 may correspond to 12V, 5V, and 3.3V, respectively, which may be generally used as supply voltages of electronic devices. However, embodiments of the inventive concepts are not limited thereto. According to some embodiments of the inventive concepts, the first external supply voltage VES1, the second external supply voltage VES2, and the third external supply voltage VES3 may have various voltage levels.

Therefore, the first power converter 110, the second power converter 120, and the third power converter 130 may generate the first inner supply voltage VIS1, the second inner supply voltage VIS2, and the third inner supply voltage VIS3 that have the same voltage level as each other when one or more of the first external supply voltage VES1, the second external supply voltage VES2, and the third external supply voltage VES3 have different voltage levels from each other, respectively.

The first diode 210 may include an anode coupled to the first node N1 and a cathode coupled to the second node N2. Therefore, the first diode 210 may be turned on when a voltage at the first node N1 is higher than a voltage at the second node N2 by a threshold voltage of the first diode 210 or more.

The second diode 220 may include an anode coupled to the second node N2 and a cathode coupled to the first node N1. Therefore, the second diode 220 may be turned on when a voltage at the second node N2 is higher than a voltage at the first node N1 by a threshold voltage of the second diode 220 or more.

The third diode 230 may include an anode coupled to the first node N1 and a cathode coupled to the third node N3. Therefore, the third diode 230 may be turned on when a voltage at the first node N1 is higher than a voltage at the third node N3 by a threshold voltage of the third diode 230 or more.

The fourth diode 240 may include an anode coupled to the second node N2 and a cathode coupled to the third node N3. Therefore, the fourth diode 240 may be turned on when a voltage at the second node N2 is higher than a voltage at the third node N3 by a threshold voltage of the fourth diode 240 or more.

The fifth diode 250 may include an anode coupled to the third node N3 and a cathode coupled to the first node N1. Therefore, the fifth diode 250 may be turned on when a voltage at the third node N3 is higher than a voltage at the first node N1 by a threshold voltage of the fifth diode 250 or more.

The sixth diode 260 may include an anode coupled to the third node N3 and a cathode coupled to the second node N2. Therefore, the sixth diode 260 may be turned on when a voltage at the third node N3 is higher than a voltage at the second node N2 by a threshold voltage of the sixth diode 260 or more.

In some embodiments of the inventive concepts, forward voltage drops of the first through sixth diodes 210, 22Q, 230, 240, 250, and 260 may be substantially the same with each other.

The first load 310 may be coupled to the first node N1 and operate using a voltage that is received through the first node N1.

The second load 320 may be coupled to the second node N2 and operate using a voltage received through the second node N2.

The third load 330 may be coupled to the third node N3 and operate using a voltage received through the third node N3.

As illustrated in FIG. 6, a structure of the power supply circuit 30 of FIG. 6 may be similar to a structure of the power supply circuit 10 of FIG. 1, and the power supply circuit 30 of FIG. 6 may correspond to an extension of the power supply circuit 10 of FIG. 1.

Therefore, as described above with reference to FIG. 2, when all of the first external supply voltage VES1, the second external supply voltage VES2, and the third external supply voltage VES3 are provided to the power supply circuit 30, each of the first through sixth diodes 210, 220, 230, 240, 250, and 260 may be turned off, such that power loss caused by a voltage drop at the first through sixth diodes 210, 220, 230, 240, 250, and 260 may not occur. In addition, since the first load 310 may operate using power that is provided through the first power line PL1, the second load 320 may operate using power that is provided through the second power line PL2, and the third load 330 may operate using power that is provided through the third power line PL3, the total power consumed by the first load 310, the second load 320, and the third load 330 may be dispersed between the first power line PL1, the second power line PL2, and the third power line PL3. Therefore, loads of the first power line PL1, the second power line PL2, and the third power line PL3 may be balanced.

On the other hand, as described above with reference to FIGS. 3 and 4, although less than all of the first external supply voltage VES1, the second external supply voltage VES2, and the third external supply voltage VES3 may be provided to the power supply circuit 30, the first load 310, the second load 320, and the third load 330 may operate stably based on the part of the first external supply voltage VES1, the second external supply voltage VES2, and the third external supply voltage VES3 that is provided to the power supply circuit 30.

Figure 7:
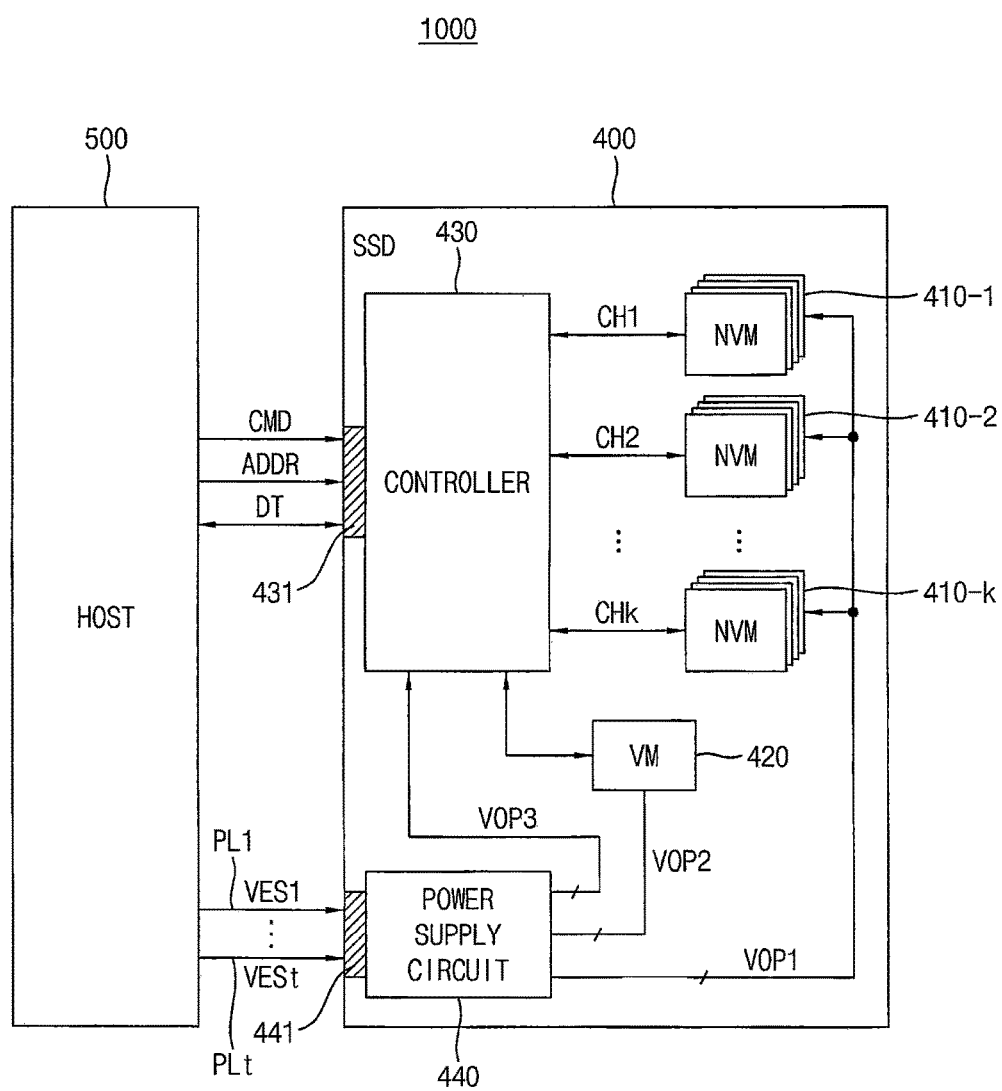
FIG. 7 is a block diagram schematically illustrating a storage system including a power supply circuit according to some embodiments of the inventive concepts.

FIG. 7 is a block diagram schematically illustrating a storage system including a power supply circuit according to some embodiments of the inventive concepts. Referring to FIG. 7, a storage system 1000 may include a storage device 400 and a host 500.

Referring to FIG. 7, the storage device 400 is illustrated as a solid state drive (SSD) device as an example. However, embodiments of the inventive concepts are not limited thereto. According to some embodiments of the inventive concepts, the storage device 400 may be any kind of storage devices.

The storage device 400 may include a plurality of nonvolatile memory devices NVM 410-1, 410-2, . . . , 410-$k$, a volatile memory device VM 420, a controller 430, and a power supply circuit 440. Here, k represents a positive integer.

The plurality of nonvolatile memory devices 410-1, 410-2, . . . , 410-$k$ may be used as a storage medium of the storage device 400. In some embodiments of the inventive concepts, each of the plurality of nonvolatile memory devices 410-1, 410-2, . . . , 410-$k$ may include a flash memory.

The controller 430 may be coupled to the plurality of nonvolatile memory devices 410-1, 410-2, . . . , 410-$k$ through a plurality of channels CH1, CH2, . . . , CHk, respectively.

The controller 430 may be configured to receive a command signal CMD and an address signal ADDR from the host 500 and communicate data DT with the host 500 through a signal connector 431. The controller 430 may write the data DT to the plurality of nonvolatile memory devices 410-1, 410-2, . . . , 410-$k$ or read the data DT from plurality of nonvolatile memory devices 410-1, 410-2, . . . , 410-$k$ based on the command signal CMD and the address signal ADDR.

The controller 430 may communicate the data DT with the host 500 using the volatile memory device 420 as an input/output buffer. In some embodiments of the inventive concepts, the volatile memory device 420 may include a DRAM (Dynamic Random Access Memory).

The power supply circuit 440 may be configured to receive first through t-th external supply voltages VES1-VESt from the host 500 through a power connector 441. For example, the power connector 441 may include first through t-th power lines PL1-PLt, and the power supply circuit 440 may be configured to receive the first through t-th external supply voltages VES1-VESt from the host 500 through the first through t-th power lines PL1-PLt, respectively. Here, t represents a positive integer.

The power supply circuit 440 may generate at least one first operation voltage VOP1 used by the plurality of nonvolatile memory devices 410-1, 410-2, . . . , 410-$k$, at least one second operation voltage VOP2 used by the volatile memory device 420, and at least one third operation voltage VOP3 used by the controller 430 based on the first through t-th external supply voltages VES1-VESt.

For example, when the power supply circuit 440 receives all of the first through t-th external supply voltages VES1-VESt from the host 500, the power supply circuit 440 may generate the at least one first operation voltage VOP1, the at least one second operation voltage VOP2, and the at least one third operation voltage VOP3 using all of the first through t-th external supply voltages VES1-VESt. On the other hand, when the power supply circuit 440 receives less than all of the first through t-th external supply voltages VES1-VESt from the host 500, the power supply circuit 440 may generate the at least one first operation voltage VOP1, the at least one second operation voltage VOP2, and the at least one third operation voltage VOP3 using all of the part of the first through t-th external supply voltages VES1-VESt that is received from the host 500.

Figure 8:
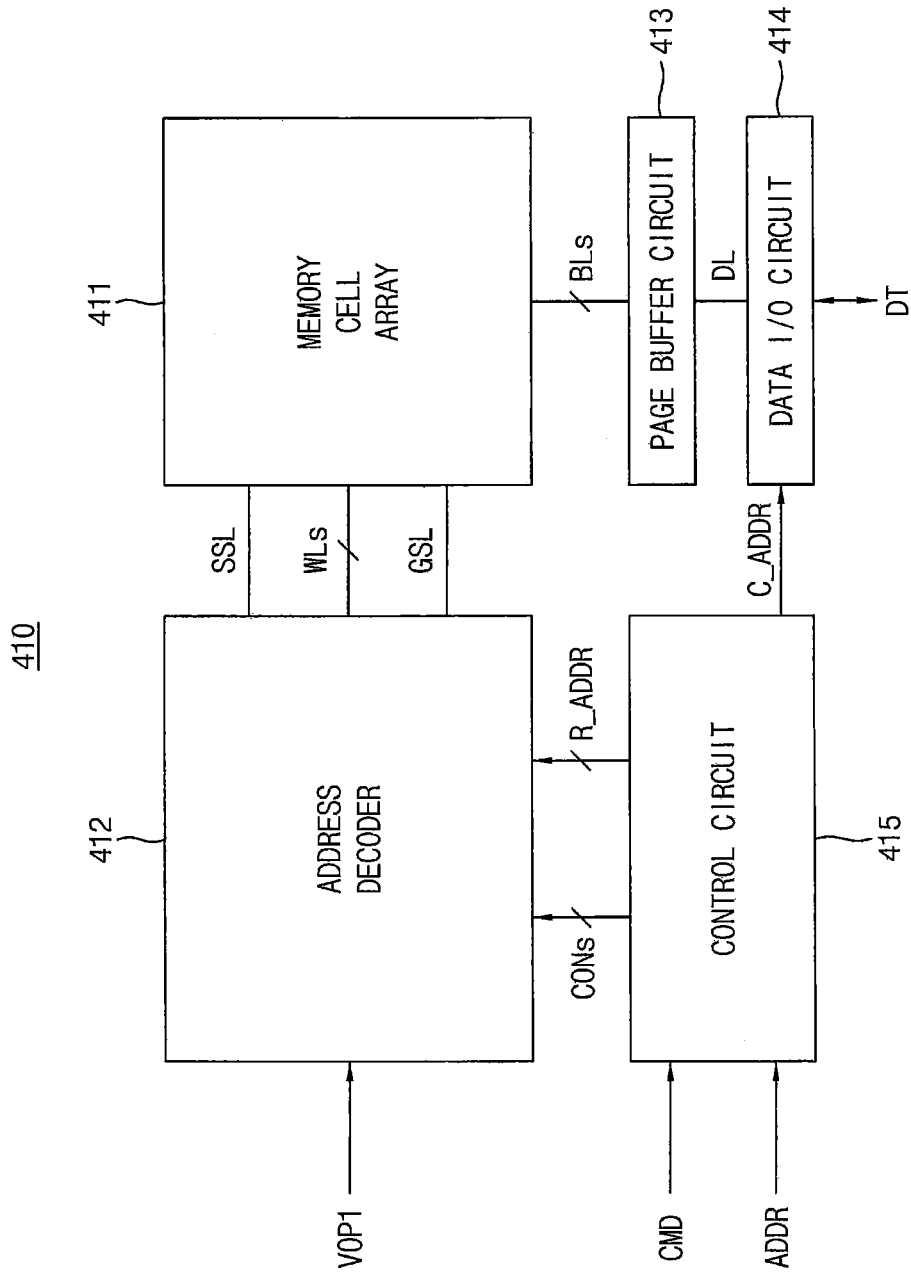
FIG. 8 is a block diagram schematically illustrating a nonvolatile memory device included in the storage system of FIG. 7 according to some embodiments of the inventive concepts.

FIG. 8 is a block diagram schematically illustrating a nonvolatile memory device included in the storage system of FIG. 7 according to some embodiments of the inventive concepts. Each of the plurality of nonvolatile memory devices 410-1, 410-2, . . . , 410-k included in the storage device 400 of FIG. 7 may be implemented with a nonvolatile memory device 410 of FIG. 8. Referring to FIG. 8, the nonvolatile memory device 410 may include a memory cell array 411, an address decoder 412, a page buffer circuit 413, a data input/output circuit 414, and control circuit 415.

The memory cell array 411 may be coupled to the address decoder 412 through a string selection line SSL, a plurality of word lines WLs, and a ground selection line GSL. In addition, the memory cell array 411 may be coupled to the page buffer circuit 413 through a plurality of bit lines BLs. The memory cell array 411 may include a plurality of memory cells coupled to the plurality of word lines WLs and the plurality of bit lines BLs.

In some embodiments of the inventive concepts, the memory cell array 411 may be a three-dimensional memory cell array that is formed on a substrate in a three-dimensional structure (or a vertical structure). In such embodiments, the memory cell array 411 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648. In some embodiments of the inventive concepts, the memory cell array 411 may be a two-dimensional memory cell array that is formed on a substrate in a two-dimensional structure (or a horizontal structure).

Figure 9:
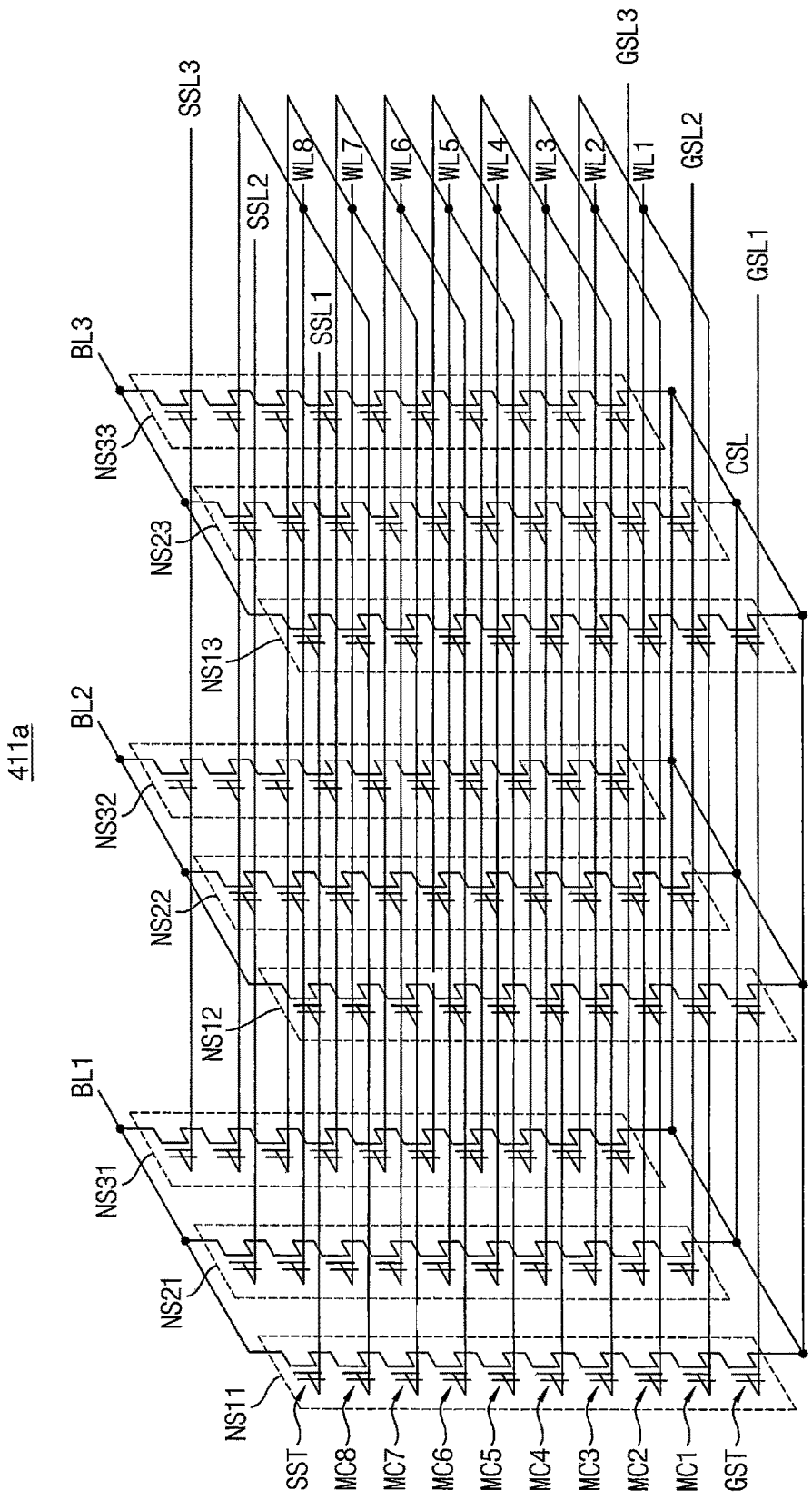
FIG. 9 is a circuit diagram schematically illustrating a memory cell array included in the nonvolatile memory device of FIG. 8 according to some embodiments of the inventive concepts.

FIG. 9 is a circuit diagram schematically illustrating a memory cell array included in the nonvolatile memory device of FIG. 8 according to some embodiments of the inventive concepts. Referring to FIG. 9, a memory cell array 411a may be formed on a substrate in a three-dimensional structure (or a vertical structure). For example, a plurality of memory cell strings included in the memory cell array 411a may be formed in a direction perpendicular to the substrate. The memory cell array 411a may include memory cell strings NS11 to NS33 coupled between bit lines BL1, BL2 and BL3 and a common source line CSL. Each of the memory cell strings NS11 to NS33 may include a string selection transistor SST, a plurality of memory cells MC1 to MC8, and a ground selection transistor GST.

In FIG. 9, each of the memory cell strings NS11 to NS33 is illustrated to include eight memory cells MC1 to MC8. However, embodiments of the inventive concepts are not limited thereto. In some embodiments of the inventive concepts, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word lines WL1 to WL8, respectively. The ground selection transistor GST may be connected to corresponding ground selection lines GSL1 to GSL3. The string selection transistor SST may be connected to corresponding bit lines BL1, BL2 and BL3, and the ground selection transistor GST may be connected to the common source line CSL. Word lines (e.g., WL1) having the same height may be commonly connected, and the ground selection lines GSL1 to GSL3 and the string selection lines SSL1 to SSL3 may be separated.

In FIG. 9, the memory cell array 411a is illustrated to be coupled to eight word lines WL1 to WL8 and three bit lines BL1 to BL3. However, embodiments of the inventive concepts are not limited thereto. In some embodiments of the inventive concepts, the memory cell array 411a may be coupled to any number of world lines and bit lines.

Figure 10:
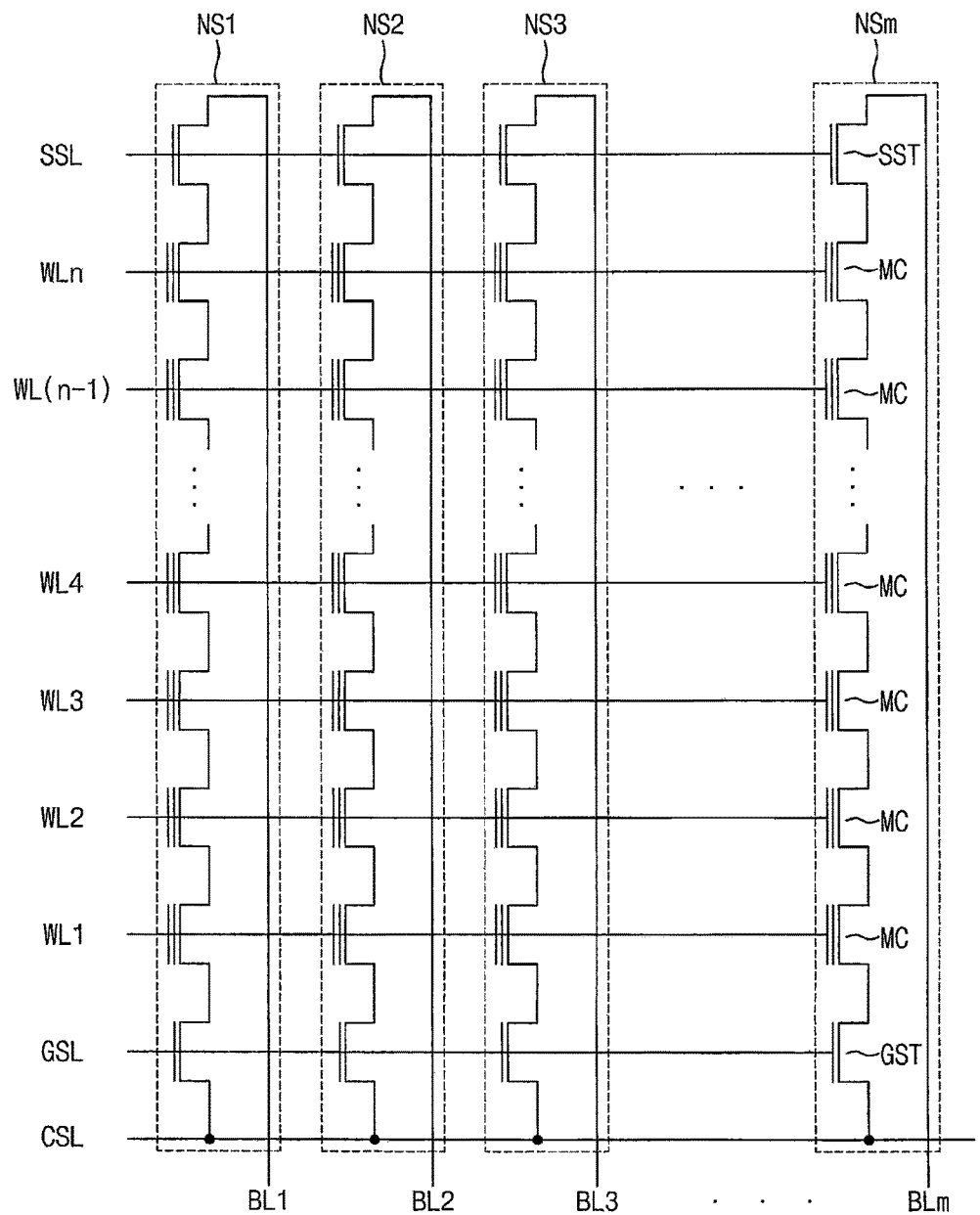
FIG. 10 is a circuit diagram schematically illustrating a memory cell array included in the nonvolatile memory device of FIG. 8 according to some embodiments of the inventive concepts.

FIG. 10 is a circuit diagram schematically illustrating a memory cell array included in the nonvolatile memory device of FIG. 8 according to some embodiments of the inventive concepts. Referring to FIG. 10, a memory cell array 411b may be formed on a substrate in a two-dimensional structure (or a horizontal structure). For example, a plurality of memory cell strings included in the memory cell array 411b may be formed in a direction parallel to the substrate.

The memory cell array 411b may include memory cell strings NS1 to NSm. Each of the memory cell strings NS1 to NSm may include a string selection transistor SST, a plurality of memory cells MC, and a ground selection transistor GST that are serially connected to each other. The string selection transistor SST included in each of the memory cell strings NS1 to NSm may be commonly connected to the string selection line SSL. Memory cells arranged in a same row among memory cells MC included in each of the memory cell strings NS1 to NSm may be commonly connected to corresponding word lines WL1 to WLn. The ground selection transistor GST included in each of the memory cell strings NS1 to NSm may be commonly connected to the ground selection line GSL. The ground selection transistor GST included in each of the memory cell strings NS1 to NSm may be commonly connected to the common source line CSL. The string selection transistor SST included in each of the memory cell strings NS1 to NSm may be connected to corresponding bit lines BL1 to BLm. Here, n and m represent positive integers.

Referring again to FIG. 8, the control circuit 415 may be configured to receive the command signal CMD and the address signal ADDR from the controller 430, and control a program operation, a read operation, and an erase operation of the nonvolatile memory device 410 based on the command signal CMD and the address signal ADDR. For example, the control circuit 415 may generate control signals CONs based on the command signal CMD, and generate a row address R_ADDR and a column address C_ADDR based on the address signal ADDR. The control circuit 415 may provide the control signals CONs and the row address R_ADDR to the address decoder 412 and provide the column address C_ADDR to the data input/output circuit 414.

The address decoder 412 may be coupled to the memory cell array 411 through the string selection line SSL, the plurality of word lines WLs, and the ground selection line GSL. In addition, the address decoder 412 may be configured to receive the at least one first operation voltage VOP1 from the power supply circuit 440. For example, the at least one first operation voltage VOP1 may include a program voltage, a pass voltage, and a program verification voltage used in the program operation, a read voltage used in the read operation, and an erase voltage used in the erase operation. The address decoder 412 may perform the program operation, the read operation, and the erase operation by applying the at least one first operation voltage VOP1 to the plurality of word lines WLs based on the control signals CONs and the row address R_ADDR.

The page buffer circuit 413 may be coupled to the memory cell array 411 through the plurality of bit lines BLs. The page buffer circuit 413 may include a plurality of page buffers. In some embodiments of the inventive concepts, one page buffer may be connected to one bit line. In some embodiments of the inventive concepts, one page buffer may be connected to two or more bit lines. The page buffer circuit 413 may temporarily store data to be programmed in a selected page or data read out from the selected page.

The data input/output circuit 414 may be coupled to the page buffer circuit 413 through data lines DL. During the program operation, the data input/output circuit 414 may be configured to receive program data DT from the controller 430 and provide the program data DT to the page buffer circuit 413 based on the column address C_ADDR that is received from the control circuit 415. During the read operation, the data input/output circuit 414 may provide read data DT, which may be stored in the page buffer circuit 413, to the controller 430 based on the column address C_ADDR that is received from the control circuit 415.

Hereinbefore, an example of the plurality of nonvolatile memory devices 410-1, 410-2, . . . , 410-k included in the storage device 400 is described with reference to FIGS. 8 to 10. However, embodiments of the inventive concepts are not limited thereto. According to some embodiments of the inventive concepts, each of the plurality of nonvolatile memory devices 410-1, 410-2, . . . , 410-k may be implemented in different structures.

Figure 11:
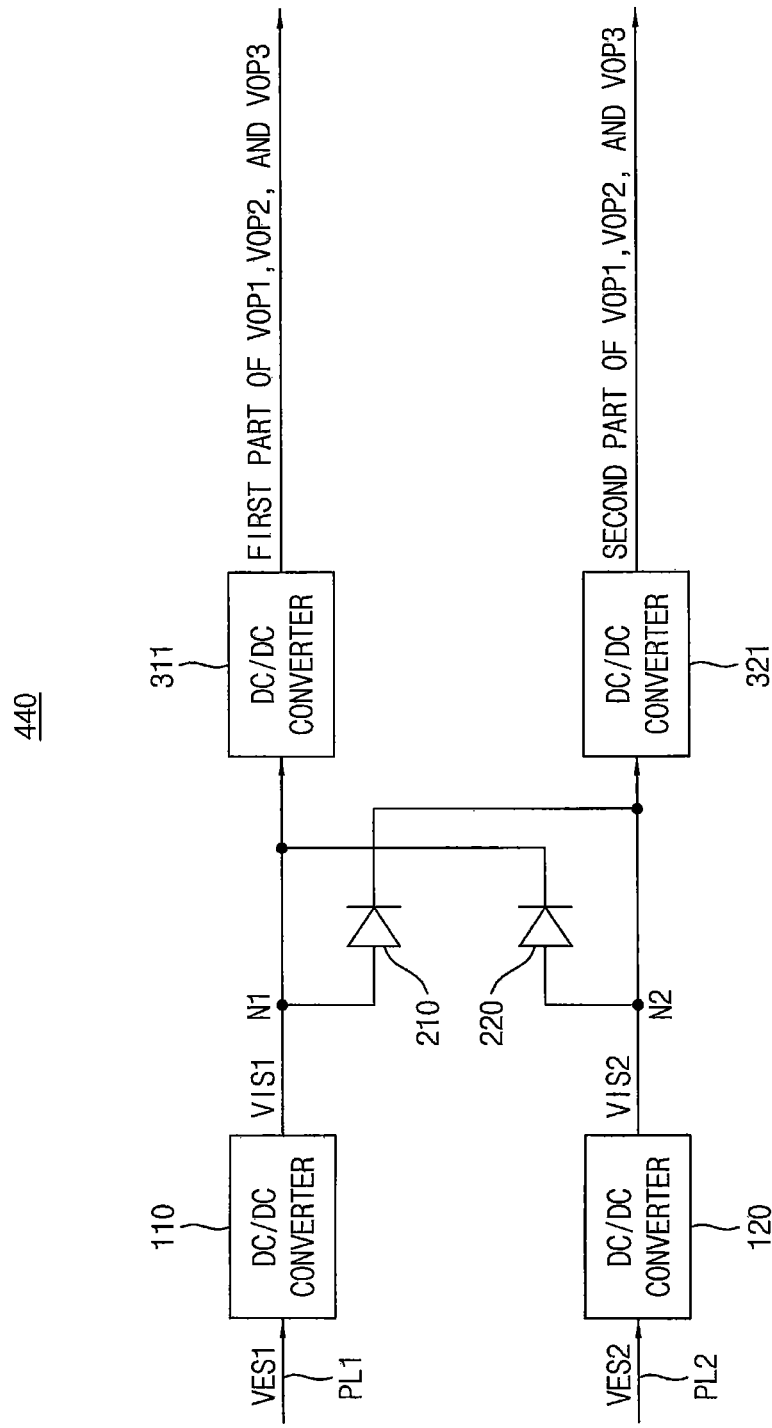
FIG. 11 is a block diagram schematically illustrating a power supply circuit included in the storage system of FIG. 7 according to some embodiments of the inventive concepts.

FIG. 11 is a block diagram schematically illustrating an example of a power supply circuit included in the storage system of FIG. 7 according to some embodiments of the inventive concepts. Referring to FIG. 11, the power supply circuit 440 is illustrated to be coupled to the host 500 through the first power line PL1 and the second power line PL2 as an example. However, embodiments of the inventive concepts are not limited thereto. The power supply circuit 440 may include a first power converter 110, a second power converter 120, a first diode 210, a second diode 220, a third power converter 311, and a fourth power converter 321.

Elements of the power supply circuit 440 of FIG. 11 may be the same as elements of the power supply circuit 10 of FIG. 1 except as described herein. For example, the first load 310 and the second load 320 included in the power supply circuit 10 may be implemented with the third power converter 311 and the fourth power converter 321 in the power supply circuit 440, respectively. Therefore, duplicated description may be omitted herein for brevity.

In some embodiments of the inventive concepts, the voltage level of the first external supply voltage VES1 may be different from the voltage level of the second external supply voltage VES2. For example, the first external supply voltage VES1 may have a voltage level of about 12V and the second external supply voltage VES2 may have a voltage level of about 5V. In addition, both of the first inner supply voltage VIS1 that is generated by the first power converter 110 and the second inner supply voltage VIS2 that is generated by the second power converter 120 may have a voltage level of about 5V. In such embodiments, the first power converter 110 may correspond to a DC/DC converter which may generate the first inner supply voltage VIS1 by decreasing the voltage level of the first external supply voltage VES1, and the second power converter 120 may correspond to a DC/DC converter which may generate the second inner supply voltage VIS2 by maintaining the voltage level of the second external supply voltage VES2. However, embodiments of the inventive concepts are not limited thereto. According to some embodiments of the inventive concepts, any one or more of the first external supply voltage VES1, the second external supply voltage VES2, the first inner supply voltage VIS1, and the second inner supply voltage VIS2 may have different voltage levels from the voltage levels described above.

The third power converter 311 may correspond to a DC/DC converter that generates a DC voltage by converting or maintaining a voltage level of a DC voltage at the first node N1, and the fourth power converter 321 may correspond to a DC/DC converter that generates a DC voltage by converting or maintaining a voltage level of a DC voltage at the second node N2.

In some embodiments of the inventive concepts, the third power converter 311 may generate a first part of the at least one first operation voltage VOP1, the at least one second operation voltage VOP2, and the at least one third operation voltage VOP3 based on a voltage that is received through the first node N1, and the fourth power converter 321 may generate a remaining second part of the at least one first operation voltage VOP1, the at least one second operation voltage VOP2, and the at least one third operation voltage VOP3 based on a voltage that is received through the second node N2. Therefore, the at least one first operation voltage VOP1, the at least one second operation voltage VOP2, and the at least one third operation voltage VOP3 that is generated by the third power converter 311 and the fourth power converter 321 may be dispersed between the plurality of nonvolatile memory devices 410-1, 410-2, . . . , 410-k, the volatile memory device 420, and the controller 430. For example, the third power converter 311 may generate the at least one first operation voltage VOP1 by increasing the voltage level of the voltage that is received through the first node N1 and provide the at least one first operation voltage VOP1 to the plurality of nonvolatile memory devices 410-1, 410-2, . . . , 410-k, while the fourth power converter 321 may generate the at least one second operation voltage VOP2 and the at least one third operation voltage VOP3 by decreasing the voltage level of the voltage that is received through the second node N2 and provide the at least one second operation voltage VOP2 and the at least one third operation voltage VOP3 to the volatile memory device 420 and the controller 430, respectively.

As described above with reference to FIG. 2, when both of the first external supply voltage VES1 and the second external supply voltage VES2 are provided to the power supply circuit 440, both of the first diode 210 and the second diode 220 may be turned off, such that power loss caused by a voltage drop at the first diode 210 and the second diode 220 may not occur. In addition, since the third power converter 311 may operate using power that is provided through the first power line PL1, and the fourth power converter 321 may operate using power that is provided through the second power line PL2, the total power consumed by the third power converter 311 and the fourth power converter 321 may be dispersed between the first power line PL1 and the second power line PL2. Therefore, loads of the first power line PL1 and the second power line PL2 may be balanced.

On the other hand, as described above with reference to FIGS. 3 and 4, although only one of the first external supply voltage VES1 and the second external supply voltage VES2 may be provided to the power supply circuit 440, the third power converter 311 and the fourth power converter 321 may operate stably based on the one of the first external supply voltage VES1 and the second external supply voltage VES2 that is provided to the power supply circuit 440.

Hereinbefore, an application of the power supply circuit 440 to the storage device 400 is described above with reference to FIGS. 7 to 11. However, embodiments of the inventive concepts are not limited thereto. According to some embodiments of the inventive concepts, the power supply circuit 440 may be used in any semiconductor devices, such as a graphic card, an image sensor, a modem, etc.

Figure 12:
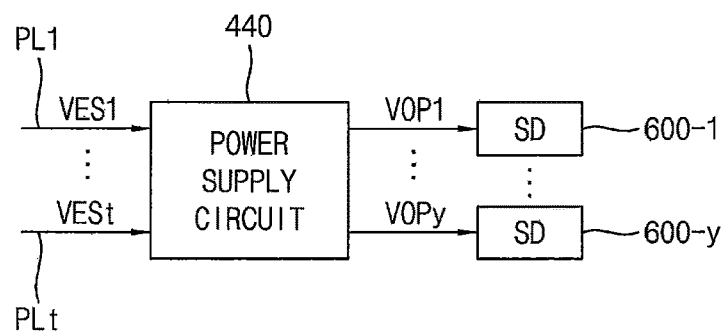
FIG. 12 is a block diagram schematically illustrating an electronic device including a power supply circuit according to some embodiments of the inventive concepts.

FIG. 12 is a block diagram schematically illustrating an electronic device including a power supply circuit according to some embodiments of the inventive concepts. Referring to FIG. 12, an electronic device 2000 may include a power supply circuit 440 and first through y-th semiconductor devices SD 600-1-600-$y$. Here, y represents a positive integer.

The power supply circuit 440 may be configured to receive first through t-th external supply voltages VES1-VESt through first through t-th power lines PL1-PLt, respectively. In addition, the power supply circuit 440 may generate first through y-th operation voltages VOP1-VOPy.

When the power supply circuit 440 receives all of the first through t-th external supply voltages VES1-VESt, the power supply circuit 440 may generate the first through y-th operation voltages VOP1-VOPy using all of the first through t-th external supply voltages VES1-VESt. On the other hand, when the power supply circuit 440 receives only a part of the first through t-th external supply voltages VES1-VESt, the power supply circuit 440 may generate the first through y-th operation voltages VOP1-VOPy using all of the part of the first through t-th external supply voltages VES1-VESt that is provided to the power supply circuit 440.

The power supply circuit 440 included in the electronic device 2000 of FIG. 12 may be the same as the power supply circuit 440 included in the storage device 400 of FIG. 7. A structure and an operation of the power supply circuit 440 included in the storage device 400 of FIG. 7 are described above with reference to FIGS. 1 to 11. Therefore, detail description of the power supply circuit 440 included in the electronic device 2000 of FIG. 12 may be omitted herein for brevity.

The first through y-th semiconductor devices 600-1-600-$y$ may operate using the first through y-th operation voltages VOP1-VOPy, respectively. Each of the first through y-th semiconductor devices 600-1-600-$y$ may be any semiconductor devices. For example, each of the first through y-th semiconductor devices 600-1-600-$y$ may be a memory device, a graphic card, an image sensor, a modem, etc.

Figure 13:
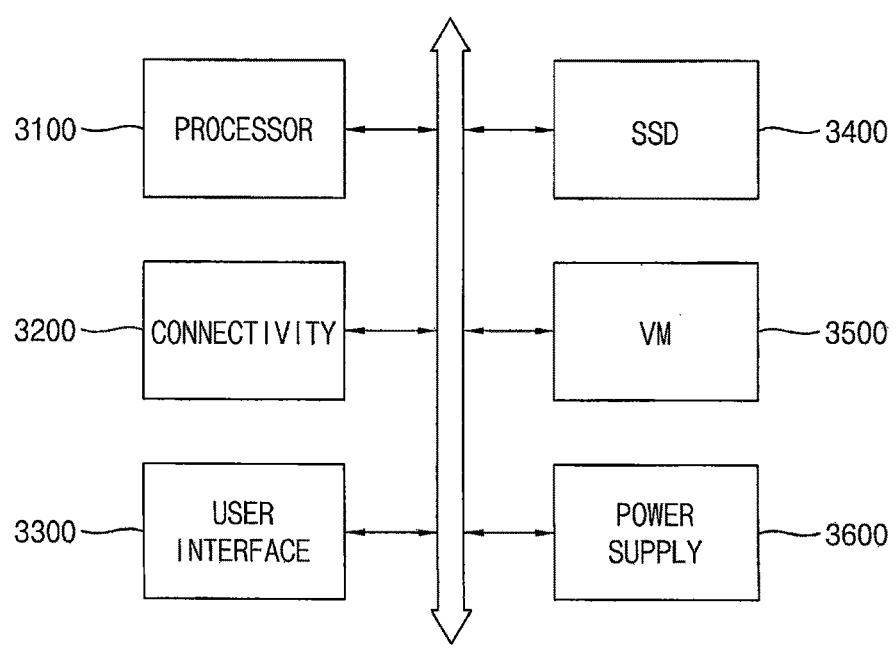
FIG. 13 is a block diagram schematically illustrating a computing system including a power supply circuit according to some embodiments of the inventive concepts.

FIG. 13 is a block diagram schematically illustrating a computing system including a power supply circuit according to some embodiments of the inventive concepts. Referring to FIG. 13, a computing system 3000 may include a processor 3100, a connectivity circuit 3200, a user interface 3300, a solid state drive device SSD 3400, a volatile memory device VM 3500, and a power supply 3600. In some embodiments, the computing system 3000 may be any kind of computing system, such as a desktop computer, a laptop computer, a server computer, etc.

The processor 3100 may execute applications, such as a web browser, a game application, a video player, etc. In some embodiments of the inventive concepts, the processor 3100 may include a single core or multiple cores. For example, the processor 3100 may be a multi-core processor, such as a dual-core processor, a quad-core processor, a hexa-core processor, etc. The processor 3100 may include an internal or external cache memory.

The connectivity circuit 3200 may perform wired or wireless communication with an external device. For example, the connectivity circuit 3200 may perform Ethernet communication, near field communication (NFC), radio frequency identification (RFID) communication, mobile telecommunication, memory card communication, universal serial bus (USB) communication, etc. In some embodiments, the connectivity circuit 3200 may include a baseband chipset that supports communications, such as global system for mobile communications (GSM), general packet radio service (GPRS), wideband code division multiple access (WCDMA), high speed downlink/uplink packet access (HSxPA), etc.

The solid state drive device 3400 may store a boot image for booting the computing system 3000. The solid state drive device 3400 may be implemented with the storage device 400 of FIG. 7. A structure and an operation of the storage device 400 of FIG. 7 are described above with reference to FIGS. 1 to 11. Therefore, detailed description of the solid state drive device 3400 may be omitted herein for brevity.

The volatile memory device 3500 may store data processed by the processor 3100, or may operate as a working memory. The user interface 3300 may include at least one input device, such as a keypad, a touch screen, etc., and at least one output device, such as a speaker, a display device, etc. The power supply 3600 may supply a power supply voltage to the computing system 3000. For example, the power supply 3600 may provide the first through t-th external supply voltages VES1-VESt to the solid state drive device 3400. In some embodiments, the computing system 3000 may further include an image processor, and/or a storage device, such as a memory card, a hard disk drive (HDD), a CD-ROM, etc. In some embodiments, the computing system 3000 and/or components of the computing system 3000 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Although a few embodiments have been described with reference to the accompanying drawings, those skilled in the art will readily appreciate that many modifications are possible in embodiments without departing from the scope of the present inventive concepts and without changing essential features. Therefore, the above-described embodiments should be considered in a descriptive sense only and not for the purposes of limitation.

What is claimed is:

1. A power supply circuit, comprising:
  a first power converter that is configured to receive a first external supply voltage, to generate a first inner supply voltage having a first voltage level based on the first external supply voltage, and to output the first inner supply voltage to a first node;

a second power converter that is configured to receive a second external supply voltage, generate a second inner supply voltage having the same first voltage level as the first inner supply voltage based on the second external supply voltage, and to output the second inner supply voltage to a second node;

a first diode comprising an anode that is coupled to the first node and a cathode that is coupled to the second node;

a second diode comprising an anode that is coupled to the second node and a cathode that is coupled to the first node;

a first load that is coupled to the first node; and a second load that is coupled to the second node.

2. The power supply circuit of claim 1, wherein the first power converter is configured to receive a voltage level of the first external supply voltage that is different from a voltage level of the second external supply voltage that the second power converter is configured to receive.

3. The power supply circuit of claim 1,
wherein the first power converter comprises a DC (direct current)/DC converter, the first inner supply voltage comprises a DC voltage, and the first external supply voltage comprises a DC voltage, and
wherein the second power converter comprises a DC/DC converter, the second inner supply voltage comprises a DC voltage, and the second external supply voltage comprises a DC voltage.

4. The power supply circuit of claim 1, wherein a forward voltage drop of the first, diode is substantially the same as a forward voltage drop of the second diode.

5. The power supply circuit of claim 1,
wherein the first load comprises a DC/DC converter that is configured to generate a first DC operation voltage by converting a magnitude of a DC voltage at the first node, and
wherein the second load comprises a DC/DC converter that is configured to generate a second DC operation voltage by converting a magnitude of a DC voltage at the second node.

6. The power supply circuit of claim 1, wherein, when the first external supply voltage is provided to the first power converter and the second external supply voltage is provided to the second power converter, the first diode and the second diode are configured to be turned off, the first load is configured to operate based on the first inner supply voltage, and the second load is configured to operate based on the second inner supply voltage.

7. The power supply circuit of claim 1, wherein, when the first external supply voltage is provided to the first power converter and the second external supply voltage to the second power converter is interrupted, the first diode is configured to be turned on, the second diode is configured to be turned off, and both of the first load and the second load are configured to operate based on the first inner supply voltage.

8. The power supply circuit of claim 1, wherein, when the first external supply voltage to the first power converter is interrupted and the second external supply voltage is provided to the second power converter, the first diode is configured to be turned off, the second diode is configured to be turned on, and the first load and the second load are configured to operate based on the second inner supply voltage.

9. The power supply circuit of claim 1, wherein the anode of the first diode and the cathode of the second diode are each directly coupled to the first node and wherein the anode of the second diode and the cathode of the first diode are directly coupled to the second node.

10. A storage device, comprising:
a plurality of nonvolatile memory devices;
a controller that is configured to control operations of the plurality of nonvolatile memory devices;
a volatile memory device that is configured to operate as an input/output buffer of the controller; and
a power supply circuit that is configured to receive a first external supply voltage and a second external supply voltage through a first power line and a second power line, respectively, and to provide a plurality of operation voltages to the plurality of nonvolatile memory devices, the controller, and the volatile memory device based on the first external supply voltage and the second external supply voltage, the power supply circuit being further configured to generate the plurality of operation voltages using both of the first external supply voltage and the second external supply voltage when the power supply circuit receives both of the first external supply voltage and the second external supply voltage, and the power supply circuit being further configured to generate the plurality of operation voltages using only one of the first external supply voltage or the second external supply voltage when the power supply circuit receives only the one of the first external supply voltage and the second external supply voltage,
wherein the power supply circuit comprises a first diode comprising an anode that is coupled to a first node and a cathode that is coupled to a second node and a second diode comprising an anode that is counted to the second node and a cathode that is coupled to the first node.

11. The storage device of claim 10, wherein the power supply circuit further comprises:
a first power converter that is configured to receive the first external supply voltage, to generate a first inner supply voltage having a first voltage level based on the first external supply voltage, and to output the first inner supply voltage to the first node;
a second power converter that is configured to receive the second external supply voltage, to generate a second inner supply voltage having the same first voltage level as the first inner supply voltage based on the second external supply voltage, and to output the second inner supply voltage to the second node;
a third power converter that is configured to generate at least a first one of the plurality of operation voltages based on a voltage that is received through the first node; and
a fourth power converter that is configured to generate at least a second one of the plurality of operation voltages based on a voltage that is received through the second node.

12. The storage device of claim 11, wherein the first power converter is configured to receive a voltage level of the first external supply voltage that is different from a voltage level of the second external supply voltage that the second power converter is configured to receive.

13. The storage device of claim 11,
wherein the first power converter is configured to receive the first external supply voltage having a voltage level of about 12V, wherein the second power converter is configured to receive the second external supply voltage having a voltage level of about 5V, and wherein the first voltage level of the first and second inner supply voltages is about 5V.

14. The storage device of claim 11, wherein each of the first through fourth power converters comprises a DC/DC converter that is configured to generate a DC voltage based on a received DC voltage.

15. The storage device of claim 10, wherein the controller is configured to receive a command signal, an address signal, and data from a host through a signal connector, and wherein the power supply circuit is configured to receive the first external supply voltage and/or the second external supply voltage from the host through a power connector.

16. The storage device of claim 10, wherein the storage device comprises a solid state drive (SSD) device.

17. A device comprising:

a first power converter that is configured to receive a first external supply voltage and to generate a first inner supply voltage having a first voltage level based on the first external supply voltage;

a second power converter that is configured to receive a second external supply voltage and to generate a second inner supply voltage having the same first voltage level as the first inner supply voltage based on the second external supply voltage;

a third power converter that is configured to receive the first inner supply voltage from the first power converter at the first voltage level when the first power converter receives the first external supply voltage, to receive a first auxiliary voltage that is based on the second inner supply voltage from the second power converter at a second voltage level that is less than the first voltage level when the first power converter does not receive the first external supply voltage and the second power converter does receive the second external supply voltage, and to generate a first operational voltage based on a received one of the first inner supply voltage or the first auxiliary voltage;

a fourth power converter that is configured to receive the second inner supply voltage from the second power converter at the first voltage level when the second power converter receives the second external supply voltage, to receive a second auxiliary voltage that is based on the first inner supply voltage from the first power converter at the second voltage level when the second power converter does not receive the second external supply voltage and the first power converter does receive the first external supply voltage, and to generate a second operational voltage based on a received one of the second inner supply voltage or the second auxiliary voltage;

a first diode that is configured to provide the first auxiliary voltage to the third power converter when the first power converter does not receive the first external supply voltage and the second power converter does receive the second external supply voltage; and a second diode that is configured to provide the second auxiliary voltage to the fourth power converter when the second power converter does not receive the second external supply voltage and the first power converter does receive the first external supply voltage, wherein a difference in voltage level between the second inner supply voltage and the first auxiliary voltage is equal to a forward voltage drop of the first diode, wherein a difference in voltage level between the first inner supply voltage and the second auxiliary voltage is equal to a forward voltage drop of the second diode, wherein the first diode comprises an anode that is coupled to a first node and a cathode that is coupled to a second node, and wherein the second diode comprises an anode that is coupled to the second node and a cathode that is coupled to the first node.

18. The device of claim 17, further comprising a power management integrated circuit comprising the first power converter and the second power converter.

19. The device of claim 17, further comprising:

a fifth a power converter that is configured to receive a third external supply voltage and to generate a third inner supply voltage having the same first voltage level as the first inner supply voltage based on the third external supply voltage; and a sixth power converter that is configured to receive the third inner supply voltage from the fifth power converter at the first voltage level when the fifth power converter receives the third external supply voltage, to receive a third auxiliary voltage that is based on at least one of the first and/or second inner supply voltages from the respective at least one of the first and/or second power converters at the second voltage level when the fifth power converter does not receive the third external supply voltage and the at least one of the first and/or second power converters does receive the respective one of the first and second external supply voltages, and to generate a third operational voltage based on a received one of the third inner supply voltage or the third auxiliary voltage.

20. The device of claim 19, further comprising:

a third diode that is configured to provide the first auxiliary voltage to the third power converter when the first power converter does not receive the first external supply voltage and the fifth power converter does receive the third external supply voltage;

a fourth diode that is configured to provide the second auxiliary voltage to the fourth power converter when the second power converter does not receive the second external supply voltage and the fifth power converter does receive the third external supply voltage;

a fifth diode that is configured to provide the third auxiliary voltage to the sixth power converter when the fifth power converter does not receive the third external supply voltage and the first power converter does receive the first external supply voltage; and a sixth diode that is configured to provide the third auxiliary voltage to the sixth power converter when the fifth power converter does not receive the third external supply voltage and the second power converter does receive the second external supply voltage.

* * * * *